United States Patent
Koyama et al.

(10) Patent No.: US 7,253,391 B2
(45) Date of Patent: Aug. 7, 2007

(54) OPTICAL SENSOR DEVICE AND ELECTRONIC APPARATUS

(75) Inventors: Jun Koyama, Kanagawa (JP); Takeshi Osada, Kanagawa (JP); Takanori Matsuzaki, Kanagawa (JP); Kazuo Nishi, Yamanashi (JP); Junya Maruyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/939,998

(22) Filed: Sep. 14, 2004

(65) Prior Publication Data

US 2005/0082463 A1    Apr. 21, 2005

(30) Foreign Application Priority Data

Sep. 19, 2003 (JP) .............................. 2003-327629
Sep. 30, 2003 (JP) .............................. 2003-342632

(51) Int. Cl.
*G01J 1/44* (2006.01)
*H03F 3/08* (2006.01)
*H01J 40/14* (2006.01)

(52) U.S. Cl. ............................. 250/214 C; 250/214 R; 250/214 A; 327/514; 330/252

(58) Field of Classification Search ............ 250/214 A, 250/214 R; 327/514; 330/252, 277, 288; 257/233, 288, 290, 431

See application file for complete search history.

(56) References Cited

U.S. PATENT DOCUMENTS

| | | | |
|---|---|---|---|
| 5,481,118 A | * | 1/1996 | Tew ............................ 250/551 |
| 5,501,989 A | | 3/1996 | Takayama et al. |
| 5,589,694 A | | 12/1996 | Takayama et al. |
| 5,648,662 A | | 7/1997 | Zhang et al. |
| 5,744,822 A | | 4/1998 | Takayama et al. |
| 5,757,456 A | | 5/1998 | Yamazaki et al. |
| 5,811,328 A | | 9/1998 | Zhang et al. |

(Continued)

FOREIGN PATENT DOCUMENTS

JP    06-045354    2/1994

(Continued)

OTHER PUBLICATIONS

"Amorphous Silicon Semiconductor Optical Sensors for Brightness Adjustment, Control of the Lighting Systems, etc., BCS series"; TDK homepage w/full translation; Jun. 2002.

(Continued)

*Primary Examiner*—Georgia Epps
*Assistant Examiner*—Patrick J. Lee
(74) *Attorney, Agent, or Firm*—Fish & Richardson P.C.

(57) ABSTRACT

In an optical sensor device employing an amorphous silicon photodiode, an external amplifier IC and the like are required due to low current capacity of the sensor element in order to improve the load driving capacity. It leads to increase in cost and mounting space of the optical sensor device. In addition, noise may easily superimpose since the photodiode and the amplifier IC are connected to each other over a printed circuit board. According to the invention, an amorphous silicon photodiode and an amplifier configured by a thin film transistor are formed integrally over a substrate so that the load driving capacity is improved while reducing cost and mounting space. Superimposing noise can be also reduced.

28 Claims, 28 Drawing Sheets

U.S. PATENT DOCUMENTS

| | | | |
|---|---|---|---|
| 5,821,138 A | 10/1998 | Yamazaki et al. | |
| 5,834,327 A | 11/1998 | Yamazaki et al. | |
| 5,955,726 A * | 9/1999 | Takashima et al. | 250/214 R |
| 6,002,157 A * | 12/1999 | Kozuka | 257/369 |
| 6,087,648 A | 7/2000 | Zhang et al. | |
| 6,118,502 A | 9/2000 | Yamazaki et al. | |
| 6,124,155 A | 9/2000 | Zhang et al. | |
| 6,166,399 A | 12/2000 | Zhang et al. | |
| 6,194,740 B1 | 2/2001 | Zhang et al. | |
| 6,198,133 B1 | 3/2001 | Yamazaki et al. | |
| 6,204,519 B1 | 3/2001 | Yamazaki et al. | |
| 6,236,063 B1 | 5/2001 | Yamazaki et al. | |
| 6,243,155 B1 | 6/2001 | Zhang et al. | |
| 6,274,861 B1 | 8/2001 | Zhang et al. | |
| 6,287,888 B1 | 9/2001 | Sakakura et al. | |
| 6,335,213 B1 | 1/2002 | Zhang et al. | |
| 6,376,333 B1 | 4/2002 | Yamazaki et al. | |
| 6,399,933 B2 | 6/2002 | Zhang et al. | |
| 6,462,806 B2 | 10/2002 | Zhang et al. | |
| 6,496,240 B1 | 12/2002 | Zhang et al. | |
| 6,531,711 B2 | 3/2003 | Sakakura et al. | |
| 6,583,439 B2 | 6/2003 | Yamazaki et al. | |
| 6,680,764 B2 | 1/2004 | Zhang et al. | |
| 6,784,411 B2 | 8/2004 | Zhang et al. | |
| 6,858,898 B1 | 2/2005 | Hayakawa et al. | |
| 6,864,950 B2 | 3/2005 | Zhang et al. | |
| 6,867,752 B1 | 3/2005 | Yamazaki et al. | |
| 6,891,391 B2 | 5/2005 | Hiroki | |
| 6,930,326 B2 | 8/2005 | Kato et al. | |
| 6,937,306 B2 | 8/2005 | Zhang et al. | |
| 6,995,753 B2 | 2/2006 | Yamazaki et al. | |
| 6,998,282 B1 | 2/2006 | Yamazaki et al. | |
| 7,030,551 B2 | 4/2006 | Yamazaki et al. | |
| 7,050,138 B1 | 5/2006 | Yamazaki et al. | |
| 2001/0030704 A1 | 10/2001 | Kimura | |
| 2001/0038065 A1 | 11/2001 | Kimura | |
| 2002/0011978 A1 | 1/2002 | Yamazaki et al. | |
| 2002/0042171 A1 | 4/2002 | Zhang et al. | |
| 2002/0044208 A1 | 4/2002 | Yamazaki et al. | |
| 2002/0074551 A1 | 6/2002 | Kimura | |
| 2002/0127785 A1 | 9/2002 | Zhang et al. | |
| 2002/0130322 A1 | 9/2002 | Zhang et al. | |
| 2003/0032210 A1 | 2/2003 | Takayama et al. | |
| 2003/0032213 A1 | 2/2003 | Yonezawa et al. | |
| 2003/0071953 A1 | 4/2003 | Yamazaki et al. | |
| 2003/0134048 A1 | 7/2003 | Shiotsuka et al. | |
| 2003/0166336 A1 | 9/2003 | Kato et al. | |
| 2003/0201450 A1 | 10/2003 | Yamazaki et al. | |
| 2003/0217805 A1 | 11/2003 | Takayama et al. | |
| 2004/0079941 A1 | 4/2004 | Yamazaki et al. | |
| 2004/0121602 A1 | 6/2004 | Maruyama et al. | |
| 2004/0217357 A1 | 11/2004 | Zhang et al. | |
| 2004/0263712 A1 | 12/2004 | Yamazaki et al. | |
| 2005/0029518 A1 | 2/2005 | Kato et al. | |
| 2005/0052584 A1 | 3/2005 | Yamazaki et al. | |
| 2005/0056842 A1 | 3/2005 | Nishi et al. | |
| 2005/0070038 A1 | 3/2005 | Yamazki et al. | |
| 2005/0082463 A1 | 4/2005 | Koyama et al. | |
| 2005/0161675 A1 | 7/2005 | Kimura | |
| 2005/0162421 A1 | 7/2005 | Yamazaki et al. | |
| 2005/0162578 A1 | 7/2005 | Yamazaki et al. | |
| 2005/0167573 A1 | 8/2005 | Maruyama et al. | |
| 2005/0195129 A1 | 9/2005 | Yamazaki et al. | |
| 2005/0202609 A1 | 9/2005 | Zhang et al. | |
| 2005/0206830 A1 | 9/2005 | Zhang et al. | |
| 2006/0082568 A1 | 4/2006 | Yamazaki et al. | |

FOREIGN PATENT DOCUMENTS

| | | |
|---|---|---|
| JP | 06-275808 | 9/1994 |
| JP | 07-086607 | 3/1995 |
| JP | 08-064795 | 3/1996 |
| JP | 08-250745 | 9/1996 |
| JP | 08-264796 | 10/1996 |
| JP | 08-288522 | 11/1996 |
| JP | 11-243209 | 9/1999 |
| JP | 2001-320547 | 11/2001 |
| JP | 2002-062856 | 2/2002 |
| JP | 202-176162 | 6/2002 |
| JP | 3329512 | 9/2002 |
| JP | 2002-305297 | 10/2002 |
| JP | 2003-047017 | 2/2003 |
| JP | 2003-060744 | 2/2003 |
| JP | 2002-174153 | 6/2003 |

OTHER PUBLICATIONS

"Developing a thin and high output visible light sensor using a plastic substrate"; TDK homepage w/full translation; Oct. 2003.

"A visible light sensor and an amplifier circuit Succeeded in forming them within the size of 2×1.5 mm on a plastic chip"; Denpa Shinbun w/full translation; Oct. 2003.

"Bring about high output and downsizing"; the Nikkan Kogyo Shimbun, LTD. w/full translation; Oct. 2003.

"Thin and high output visible light sensor"; Kagaku Kougyou Shinbun w/full translation; Oct. 2003.

* cited by examiner top view side view bottom view

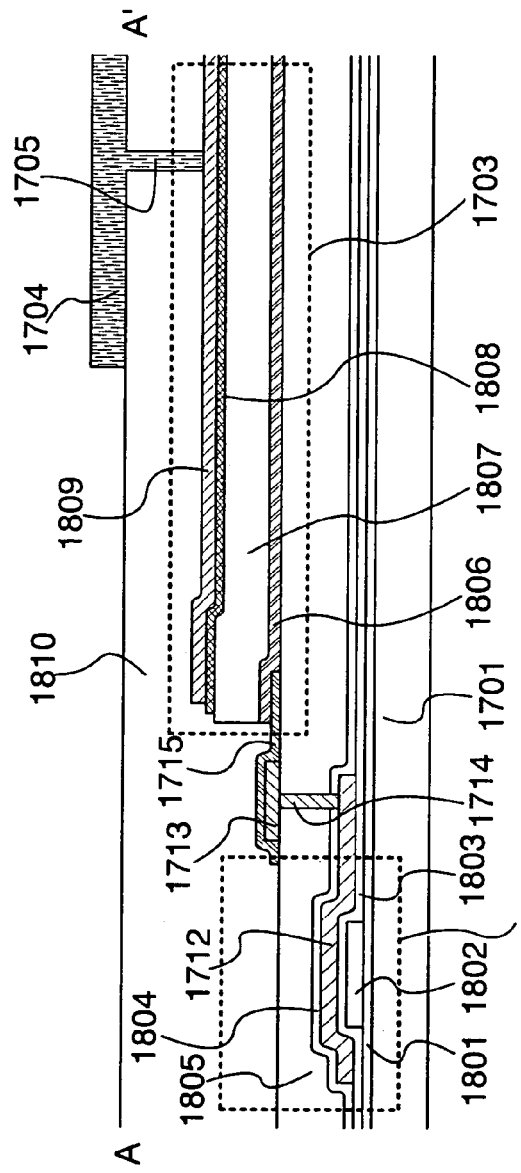
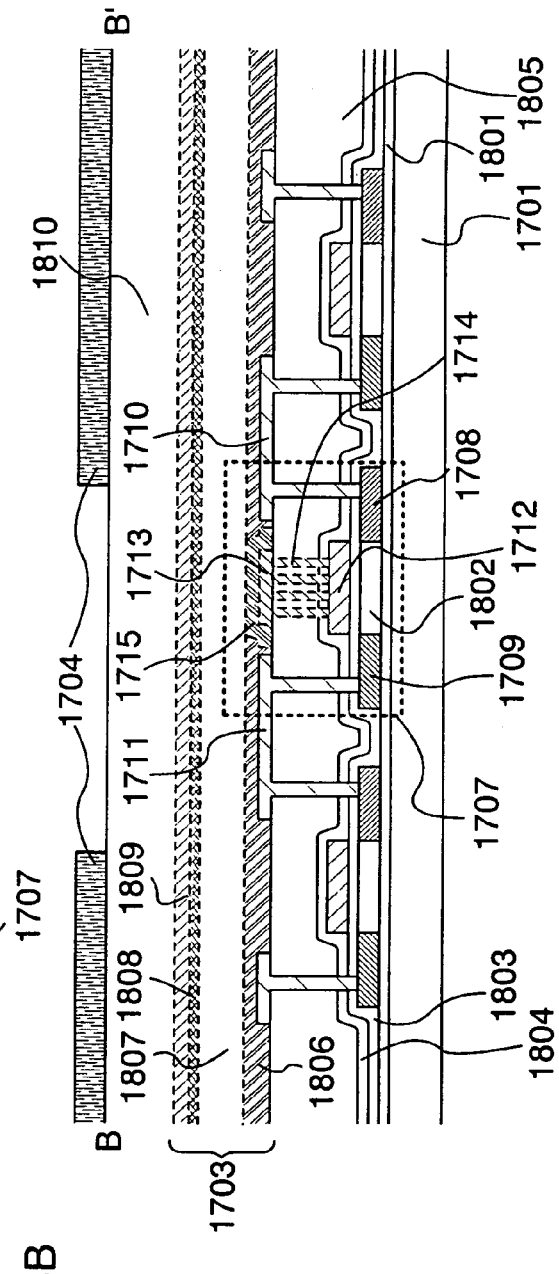
FIG. 18A
FIG. 18B

OPTICAL SENSOR DEVICE AND ELECTRONIC APPARATUS

BACKGROUND OF THE INVENTION

1. Field of the Invention

The present invention relates to an optical sensor device, and particularly to an optical sensor device configured by a thin film semiconductor element. Further, the invention relates to an electronic apparatus using the optical sensor device.

2. Description of the Related Art

In recent years, cellular phones have been widely used with the advance of telecommunication technology. In future, transmission of moving images and transmission of a larger volume of information are expected. In addition, through reduction in weight of personal computers, those adapted for mobile communication have been produced. Information terminals called PDAs originated in electronic notebooks have also been produced in large quantities and widely used. With the development of display devices, the majority of portable information devices is equipped with a flat panel display.

In such a display device, brightness of the periphery thereof is detected so as to control the display luminance. The suitable display luminance obtained by detecting the peripheral brightness enables power reduction. An optical sensor device for controlling luminance is applied to cellular phones, personal computers, and the like. (e.g., Patent Document 1).

Meanwhile, an optical sensor device is used for the convergence control in a display device having a projector. In the convergence control, an image is controlled so as not to cause the deviation of respective images of each color of RGB. Each image position of RGB is detected to dispose the image at an appropriate position by using an optical sensor. (e.g., Patent Document 2).

These optical sensor devices adopt an amorphous silicon photodiode. Compared to a single crystal silicon photodiode, an amorphous silicon photodiode is less sensitive to the light on the long wavelength side, namely in the infrared region. Respective sensitive characteristics of the amorphous silicon photodiode and the single crystal silicon photodiode are shown in FIG. 13. The amorphous silicon photodiode is less sensitive to the light in the region except the visible light region, which is similar to the human visual sensitivity. On the other hand, the single crystal silicon photodiode is much sensitive even to the light in the infrared region. Therefore, the single crystal silicon photodiode reacts differently from the visual sensitivity in the case where there is some infrared light. This is why the optical sensor device using the amorphous silicon photodiode is suitable for this case.

The above-described optical sensor device configured by the amorphous silicon photodiode has the following problem. As for an amorphous silicon photodiode, output current thereof is smaller than that of a single crystal silicon photodiode while the light sensitivity is close to the human visual sensitivity as mentioned above. Thus, it is difficult for the amorphous silicon photodiode to drive another circuit directly. The optical sensor device is, consequently, configured by the combination of an amorphous silicon photodiode 502, an external amplifier circuit 501, and a feedback resistor 503 so that output current of the amorphous silicon photodiode 502 is converted into voltage by the feedback resistor 503, which is then outputted from an output terminal 504 as a voltage output.

[Patent Document 1] Japanese Patent Laid-Open No. 2003-60744

[Patent Document 2] Japanese Patent Laid-Open No. 2003-47017

SUMMARY OF THE INVENTION

The above-described conventional optical sensor device is configured by the combination of the amorphous silicon photodiode 502, the external amplifier circuit 501, and the feedback resistor 503, causing problems such as high cost and large mounting space. In addition, noise may easily superimpose since an output of the amorphous silicon photodiode 502 is connected to the external amplifier circuit 501 over a printed circuit board.

In view of solving the above problem, according to the invention, an optical sensor element and an amplifier circuit using a thin film transistor are formed integrally. An optical sensor element using amorphous silicon (e.g., an amorphous silicon photodiode) is generally formed over an insulating substrate. Similarly, a thin film transistor is generally formed over an insulating substrate as well as the optical sensor element, therefore, they are common in many points. In an optical sensor device according to the invention, an optical sensor element and an amplifier circuit using a thin film transistor (abbreviated to a TFT hereinafter) are formed integrally over a substrate so that reductions in cost and mounting space can be realized. In addition, noise is less likely to superimpose in the optical sensor device according to the invention since the optical sensor element and the amplifier circuit are directly connected to each other over a sensor substrate.

The invention is applicable to an optical sensor element using polysilicon (e.g., a polysilicon photodiode) as well as an optical sensor element using amorphous silicon.

Described below is a structure of the invention.

According to the invention, in an optical sensor device comprising an optical sensor element and an amplifier circuit, the optical sensor element and the amplifier circuit are formed integrally over a substrate.

According to the invention, in the above configuration, an optical sensor element comprises amorphous silicon.

According to the invention, in the above configuration, an optical sensor element is configured by an amorphous silicon photodiode.

According to the invention, in the above configuration, an optical sensor element comprises polysilicon.

According to the invention, in the above configuration, an optical sensor element is configured by a polysilicon photodiode.

According to the invention, in an optical sensor device comprising an optical sensor element and an amplifier circuit, the amplifier circuit is configured by a thin film transistor, and the optical sensor element and the amplifier circuit are formed integrally over a substrate.

According to the invention, in an optical sensor device comprising an optical sensor element and an amplifier circuit, the amplifier circuit is an operational amplifier configured by a thin film transistor, and the optical sensor element and the amplifier circuit are formed integrally over a substrate.

According to the invention, in an optical sensor device comprising an optical sensor element, an amplifier circuit, and a feedback resistor, the amplifier circuit is an operational amplifier configured by a thin film transistor, the optical sensor element and the amplifier circuit are formed integrally over a substrate, and the feedback resistor is provided outside of the substrate.

According to the invention, in an optical sensor device comprising an optical sensor element, an amplifier circuit, and a current-voltage conversion resistor (abbreviation: I-V conversion resistor), the amplifier circuit is an operational amplifier configured by a thin film transistor, the optical sensor element and the amplifier circuit are formed integrally over a substrate, and the I-V conversion resistor is provided outside of the substrate.

According to the invention, in an optical sensor device comprising an optical sensor element, an amplifier circuit, and a level shift circuit, the amplifier circuit and the level shift circuit are configured by a thin film transistor, and the optical sensor element, the amplifier circuit, and the level shift circuit are formed integrally over a substrate.

According to the invention, in the above configuration, the level shift circuit is configured by a P-channel TFT and a constant current source.

According to the invention, in the above configuration, the level shift circuit is configured by an N-channel TFT and a constant current source.

According to the invention, in the above configuration, the substrate comprises four electrode terminals for connection thereon.

According to the invention, in the above configuration, the substrate comprises four electrode terminals for connection thereon, and two of them are power source terminals.

According to the invention, in an optical sensor device comprising an optical sensor element and an amplifier circuit, the amplifier circuit is a current mirror circuit configured by a thin film transistor, and the optical sensor element and the amplifier circuit are formed integrally over a substrate.

According to the invention, in the above configuration, the current mirror circuit is configured with the multigate structure in which a TFT has a plurality of gates.

According to the invention, in the above configuration, the current mirror circuit is configured with the cascode connection.

According to the invention, in the above configuration, the current mirror circuit is configured with the Wilson connection.

According to the invention, in the above configuration, the current mirror circuit is configured with the improved Wilson connection.

According to the invention, in the above configuration, the amplification ratio can be controlled by arbitrarily changing the number, the gate length L, and the gate width W of TFTs of a current mirror circuit.

According to the invention, in the above configuration, the current mirror circuit is configured by an N-channel TFT.

According to the invention, in the above configuration, the current mirror circuit is configured by a P-channel TFT.

According to the invention, in the above configuration, the substrate comprises two electrical electrode terminals for connection thereon.

According to the invention, in the above configuration, the optical sensor element and the amplifier circuit are formed integrally over a plastic substrate.

According to the invention, in the above configuration, the optical sensor element and the amplifier circuit are formed integrally over a glass substrate.

The invention provides an electronic apparatus having the above-described optical sensor device.

As described hereinbefore, in an optical sensor device according to the invention, a photodiode and an amplifier circuit using a TFT are formed integrally over a sensor substrate so that reductions in cost and mounting space can be realized and superimposing noise can be reduced.

BRIEF DESCRIPTION OF THE DRAWINGS

FIGS. 18A and 18B are views each showing an example of a cross-sectional structure of an optical sensor device of the invention.

DETAILED DESCRIPTION OF THE INVENTION

Although the invention is fully described by way of Embodiment Modes and Embodiments with reference to the accompanying drawings, it is to be understood that various changes and modifications will be apparent to those skilled in the art. Therefore, unless such changes and modifications depart from the scope of the invention hereinafter defined, they should be constructed as being included therein.

In Embodiment Modes of the invention, the case where reverse voltage (reverse bias) is applied to a photodiode to drive is described. That is, voltage is applied in the direction from a second electrode toward a first electrode. The first electrode means an electrode that contacts with a p-type layer of an amorphous silicon layer of the photodiode, while the second electrode means an electrode that contacts with an n-type layer thereof.

[Embodiment Mode 1]

Figure 1:
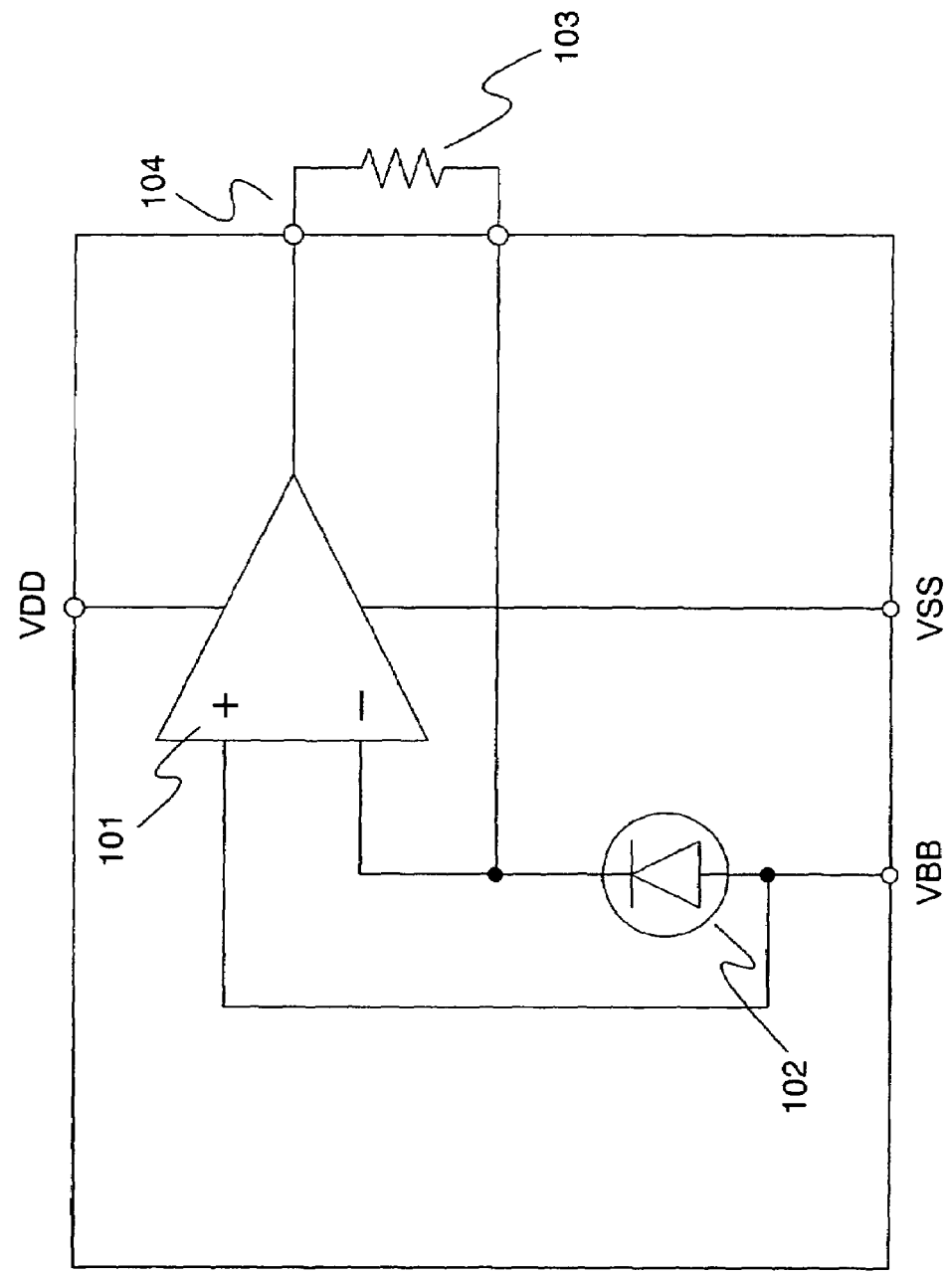
FIG. 1 is a diagram showing an embodiment mode of an optical sensor device of the invention.

FIG. 1 shows the first embodiment mode of the invention. In this embodiment mode, an amplifier circuit 101 configured by a TFT and a photodiode 102 are formed integrally over a sensor substrate. An operation thereof is described below. A non-inverting input terminal of the amplifier circuit 101 is connected to an external power source VBB. The external power source VBB has a potential between a high-potential-side power source VDD and a low-potential-side power source VSS of the amplifier circuit 101. A first electrode of the photodiode 102 is connected to the external power source VBB and a second electrode thereof is connected to an inverting input terminal of the amplifier circuit 101 and a first terminal of a feedback resistor 103. A second terminal of the feedback resistor 103 is connected to an output terminal 104 of the amplifier circuit 101. Note that the feedback resistor 103 is formed outside of the sensor substrate in order to reduce the fluctuation of an output voltage of the amplifier circuit 101, however, the feedback resistor 103 may be formed over the sensor substrate in the case where the fluctuation is within an acceptable range.

When light is inputted to the photodiode 102, optical current flows in the direction from the second electrode toward the first electrode of the photodiode 102. Consequently, current flows through the output terminal 104 of the amplifier circuit 101 toward the feedback resistor 103, generating voltage between both the terminals of the feedback resistor 103.

Note that high driving capacity may be provided with the amplifier circuit 101 in this embodiment mode, therefore, an optical sensor circuit may drive a load connected to the output terminal 104.

Figure 7:
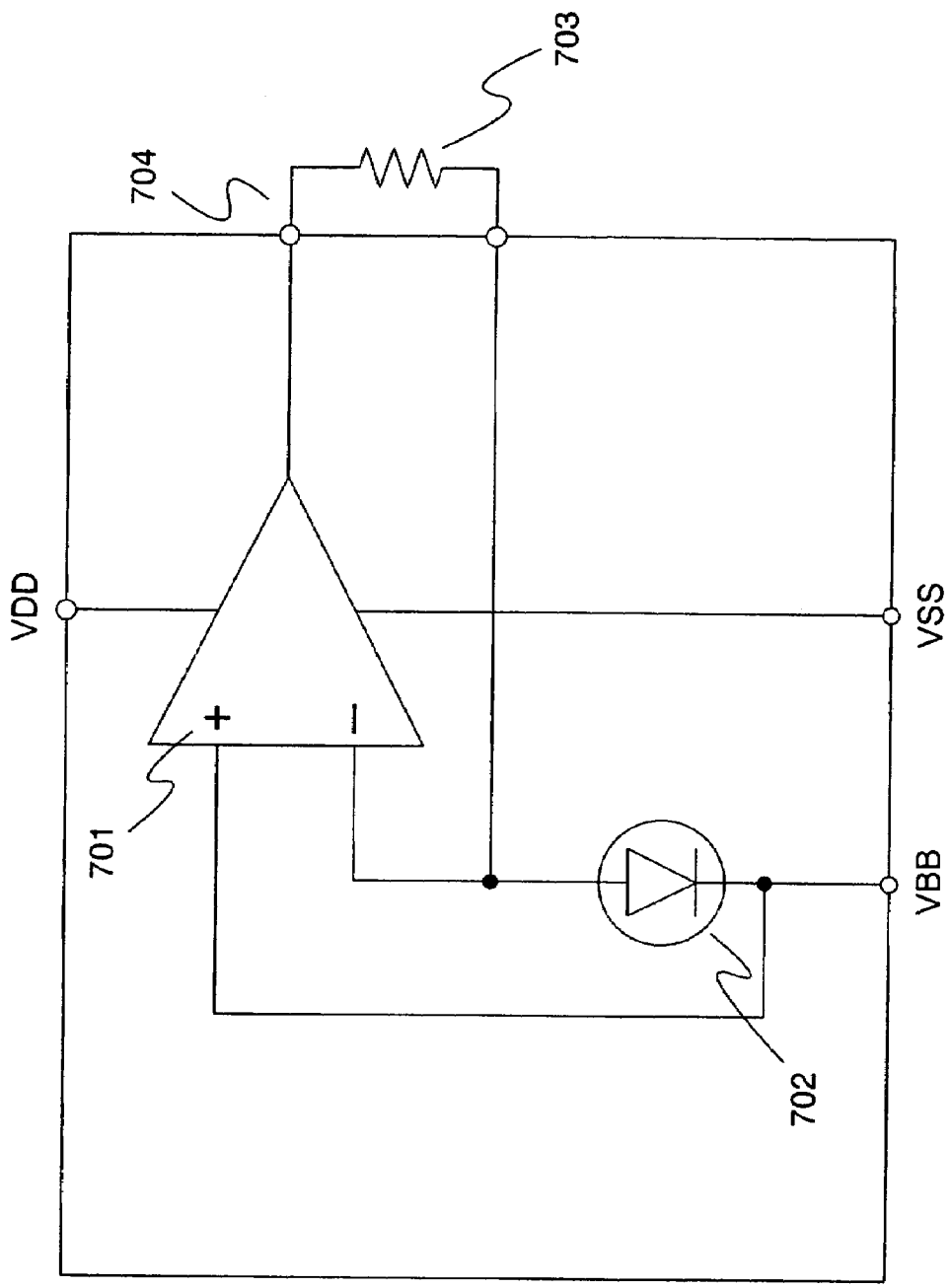
FIG. 7 is a diagram showing an embodiment mode of an optical sensor device of the invention.

In FIG. 7, a photodiode is connected in inverse to the photodiode 102 in FIG. 1. An optical sensor circuit shown in FIG. 7 comprises an amplifier circuit 701, a photodiode 702, and a feedback resistor 703. A first electrode of the photodiode 702 is connected to an inverting input terminal of the amplifier circuit 701 and the feedback resistor 703 and a second electrode thereof is connected to an external power source VBB and a non-inverting input terminal of the amplifier circuit 701. Current flows from the external power source VBB toward an output terminal 704 of the amplifier circuit 701 through the photodiode 702 and the feedback resistor 703. As described above, the direction of a photodiode is not exclusively limited.

Note that the amplifier circuits 101 and 701 are operational amplifiers in this embodiment mode, however, the amplifier circuits 101 and 701 are not limited to the operational amplifiers.

In addition, other optical sensor element may be employed as a substitute for the photodiode.

[Embodiment Mode 2]

Figure 2:
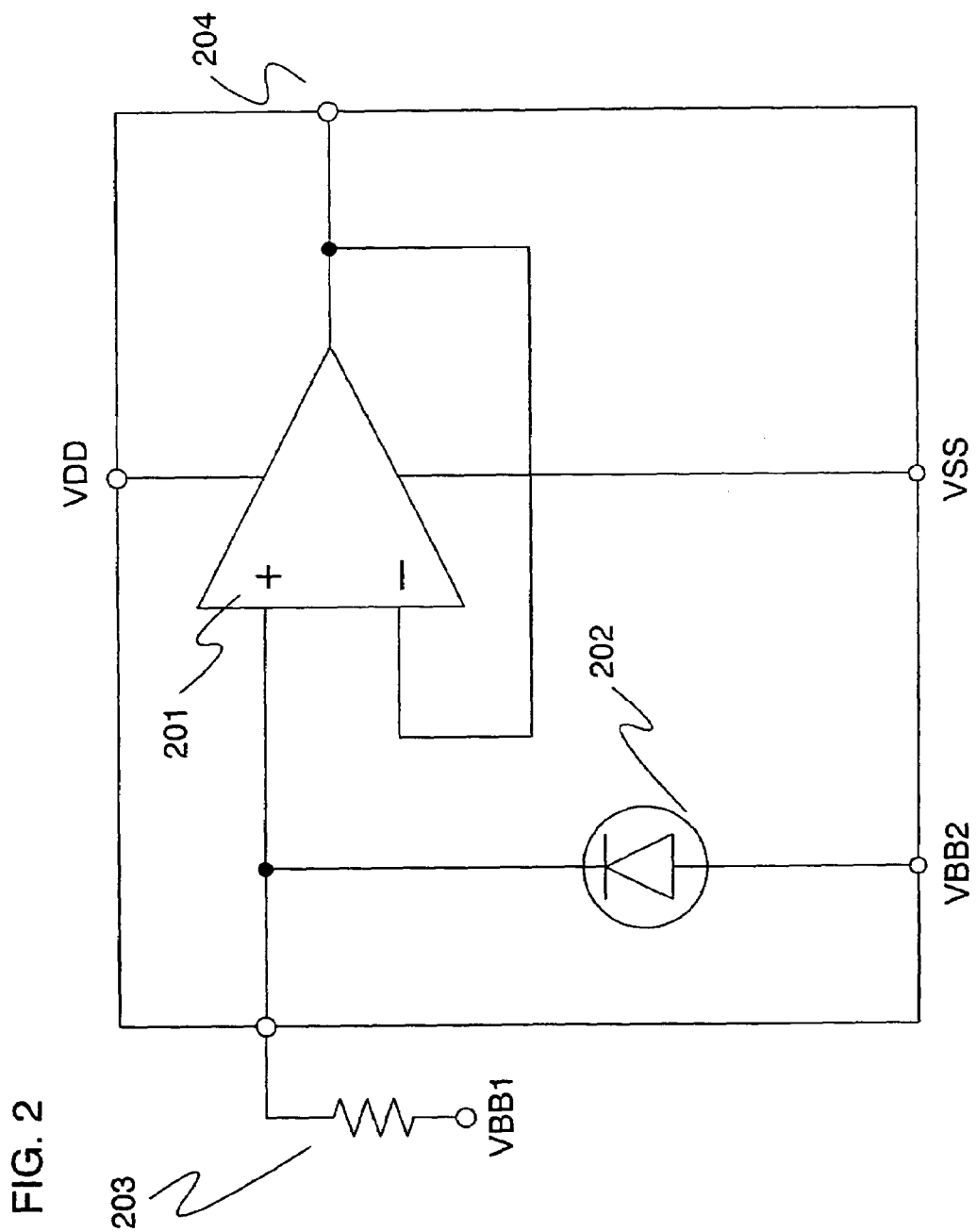
FIG. 2 is a diagram showing an embodiment mode of an optical sensor device of the invention.

FIG. 2 shows the second embodiment mode of the invention. In this embodiment mode, an amplifier circuit 201 configured by a TFT and a photodiode 202 are formed integrally over a sensor substrate. An operation thereof is described below. A non-inverting input terminal of the amplifier circuit 201 is connected to a first terminal of an I-V conversion resistor 203 and a second electrode of the photodiode 202. An output terminal 204 of the amplifier circuit 201 is connected to an inverting terminal thereof, that is, the amplifier circuit 201 is a voltage follower. A first electrode of the photodiode 202 is connected to an external power source VBB2. A second terminal of the I-V conversion resistor 203 is connected to an external power source VBB1. Note that the I-V conversion resistor 203 is formed outside of the sensor substrate in order to reduce the fluctuation of an output voltage, however, the I-V conversion resistor 203 may be formed over the sensor substrate in the case where the fluctuation is within the acceptable range.

When light is inputted to the photodiode 202, optical current flows from the external power source VBB1 in the direction from the second electrode toward the first electrode of the photodiode 202 through the I-V conversion resister 203. Consequently, voltage is generated between both the terminals of the I-V conversion resistor 203.

That is, a potential equal to that of the VBB1 is outputted to the output terminal 204 in the case where no light is inputted and no current flows into the photodiode 202 whereas in the case where light is inputted and current flows into the photodiode 202, potential of the output terminal 204 drops in proportion to the amount of current.

Note that high driving capacity may be provided with the amplifier circuit 201 in this embodiment mode, therefore, an optical sensor circuit may drive a load connected to the output terminal 204.

Figure 8:
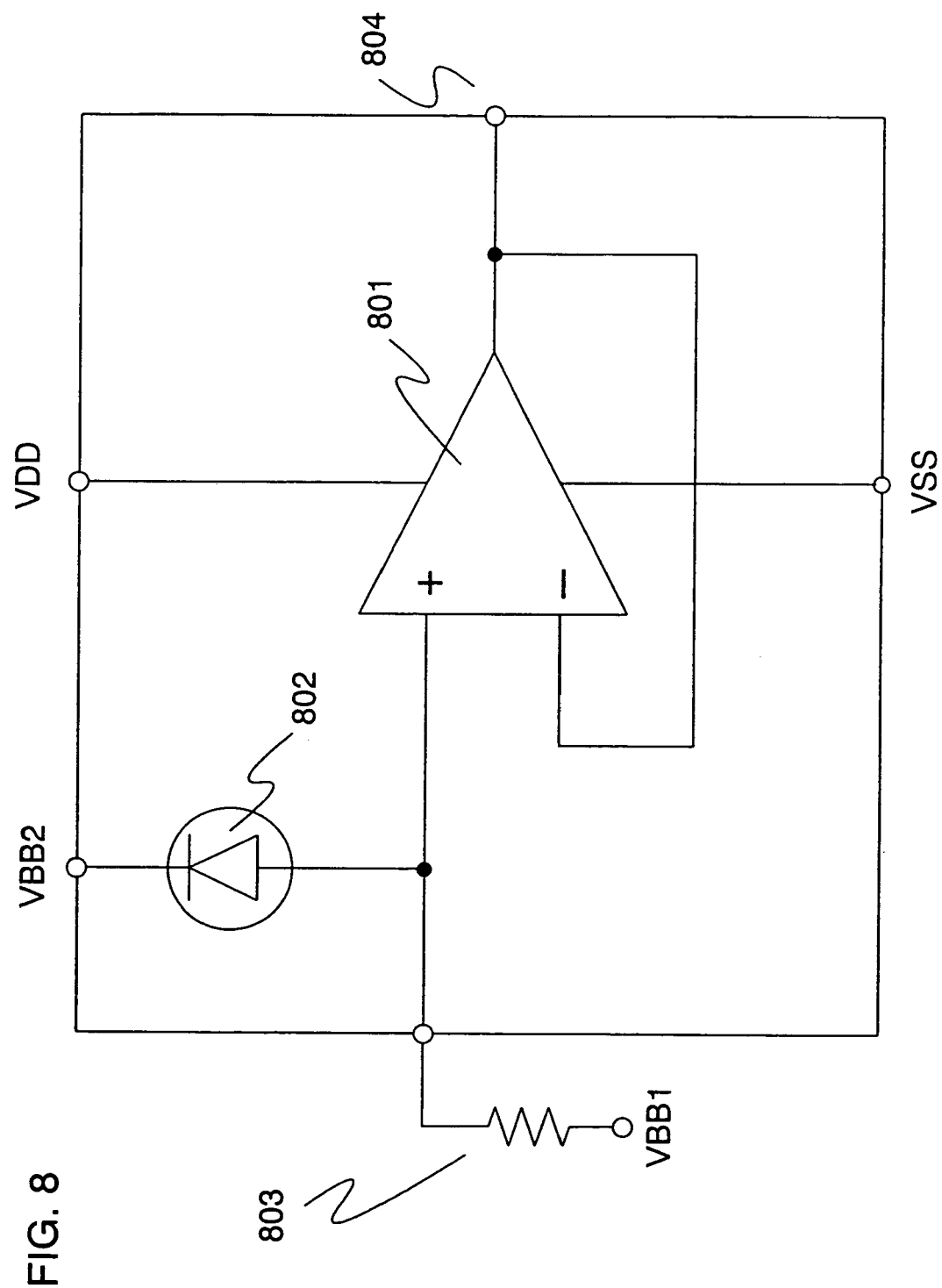
FIG. 8 is a diagram showing an embodiment mode of an optical sensor device of the invention.

In FIG. 8, a photodiode is connected in inverse to the photodiode 202 in FIG. 2. An optical sensor circuit shown in FIG. 8 comprises an amplifier circuit 801, a photodiode 802, and an I-V conversion resistor 803. A first electrode of the photodiode 802 is connected to a non-inverting input terminal of the amplifier circuit 801 and the I-V conversion resistor 803 and a second electrode thereof is connected to an external power source VBB2. Current flows from the external power source VBB2 toward an external power source VBB1 through the photodiode 802 and the I-V conversion resistor 803. As described above, the direction of a photodiode is not exclusively limited.

Note that the amplifier circuits 201 and 801 are operational amplifiers in this embodiment mode, however, the amplifier circuits 201 and 801 are not limited to the operational amplifiers.

In addition, other optical sensor element may be employed as a substitute for the photodiode.

[Embodiment Mode 3]

Figure 3:
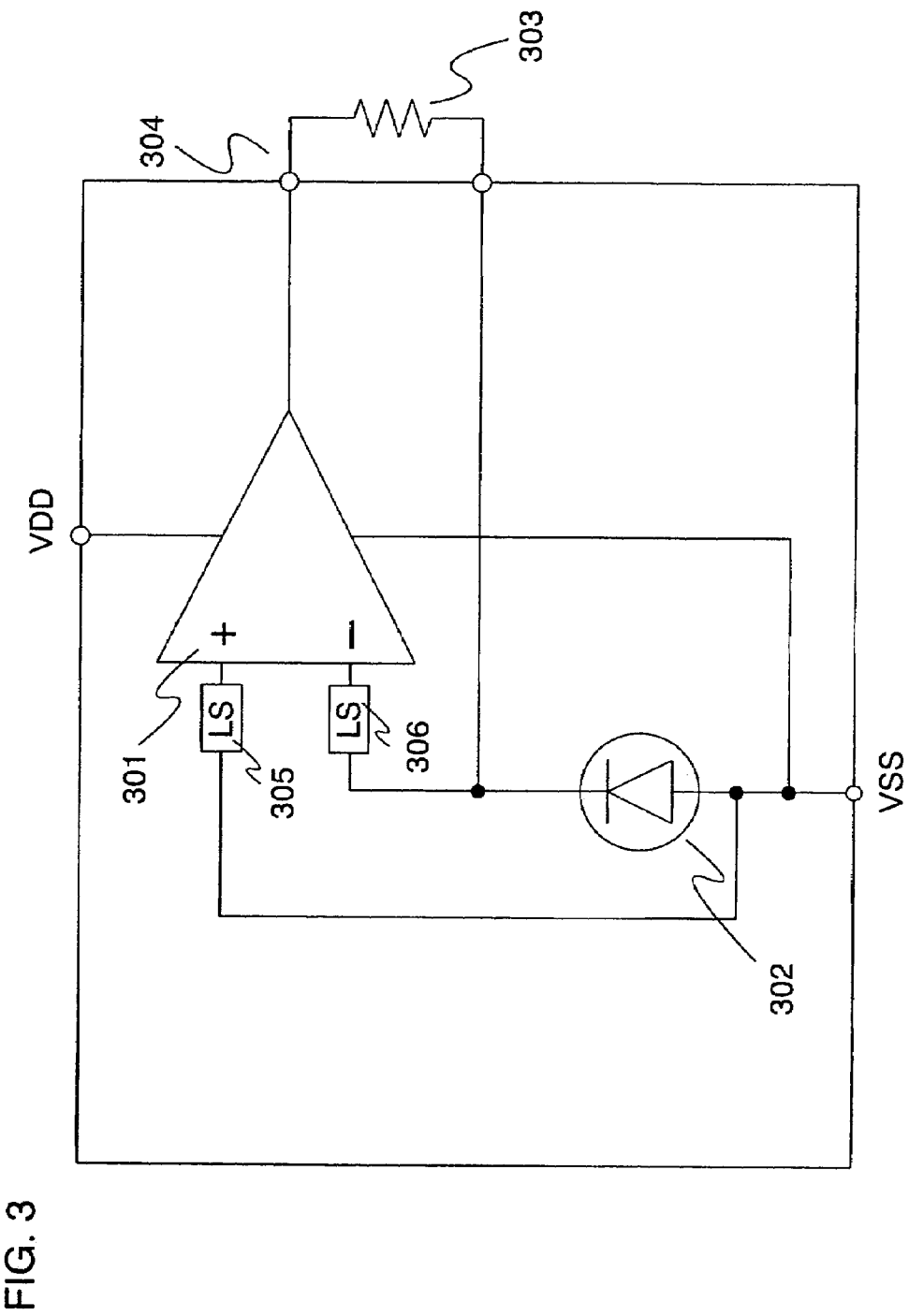
FIG. 3 is a diagram showing an embodiment mode of an optical sensor device of the invention.

FIG. 3 shows the third embodiment mode of the invention. In this embodiment mode, an amplifier circuit 301 configured by a TFT, a photodiode 302, and level shift circuits 305 and 306 are formed integrally over a sensor substrate. An operation thereof is described below. An input of the level shift circuit 305 is connected to a low-potentialside power source VSS and an output thereof is connected to a non-inverting input terminal of the amplifier circuit 301. An input of the level shift circuit 306 is connected to a second electrode of the photodiode 302 and a first terminal of a feedback resistor 303 and an output thereof is connected to an inverting input terminal of the amplifier circuit 301. A second terminal of the feedback resistor 303 is connected to an output terminal 304 of the amplifier circuit 301. A first electrode of the photodiode 302 is connected to the low-potential-side power source VSS. Note that the feedback resistor 303 is formed outside of the sensor substrate in order to reduce the fluctuation of an output voltage of the amplifier circuit 301, however, the feedback resistor 303 may be formed over the sensor substrate in the case where the fluctuation is within the acceptable range.

When light is inputted to the photodiode 302, optical current flows in the direction from the second electrode toward the first electrode of the photodiode 302. Consequently, current flows through the output terminal 304 of the amplifier circuit 301 toward the feedback resistor 303, generating voltage between both the terminals of the feedback resistor 303.

Note that high driving capacity may be provided with the amplifier circuit 301 in this embodiment mode, therefore, an optical sensor circuit may drive a load connected to the output terminal 304.

Such a level shift circuit brings the following advantages.

Figure 6A:
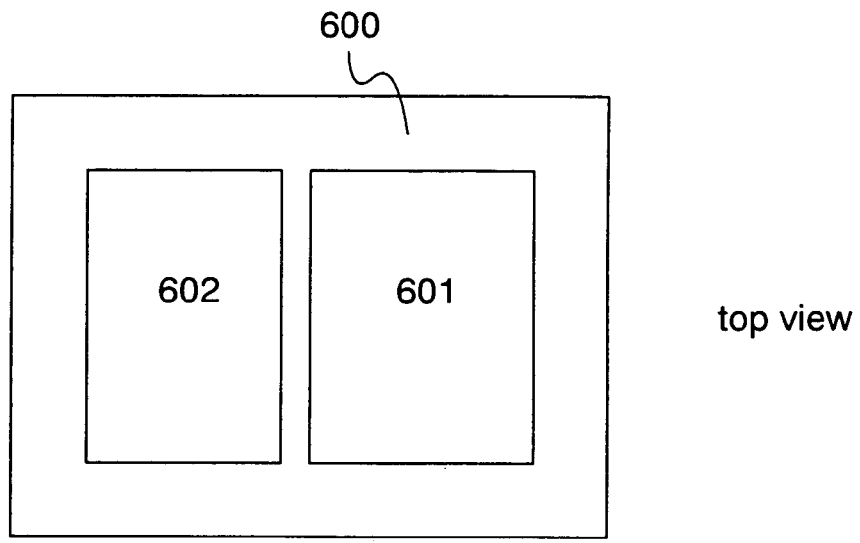
FIGS. 6A to 6C are views each showing an outward of an optical sensor device of the invention.
Figure 6B:
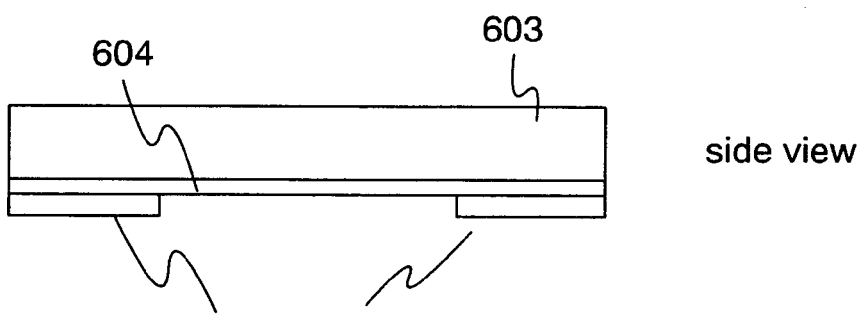
Figure 6C:
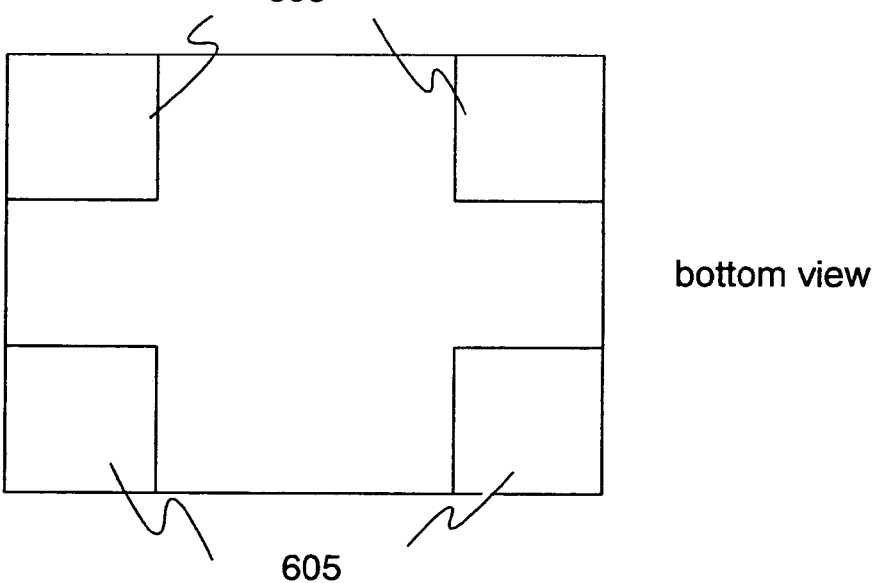

FIGS. 6A to 6C are outward views of an integrated sensor chip 600. As shown in FIG. 6A, a photodiode portion 601 and an amplifier circuit portion 602 are formed on a top surface of the integrated sensor chip 600. As shown in a side view of FIG. 6B and a bottom view of FIG. 6C, a TFT forming region 604 and an electrode terminal for connection 605 are formed in this order on a bottom surface of a substrate 603 of the integrated sensor chip 600. In view of strength, it is preferable that an electrode terminal for connection is formed at four points over such a sensor chip, then the sensor chip is mounted on a printed circuit board and the like. However, the aforementioned first embodiment mode does not conform to the above since the number of terminals is five.

Furthermore, the power source VBB is required in addition to the high-potential-side power source VDD and the low-potential-side power source VSS in the first embodiment mode. The number of power sources can be reduced by means of a level shifter as shown in FIG. 3.

Note that the amplifier circuit 301 is an operational amplifier in this embodiment mode, however, the amplifier circuit 301 is not limited to the operational amplifier.

In addition, other optical sensor element may be employed as a substitute for the photodiode.

[Embodiment Mode 4]

Figure 4:
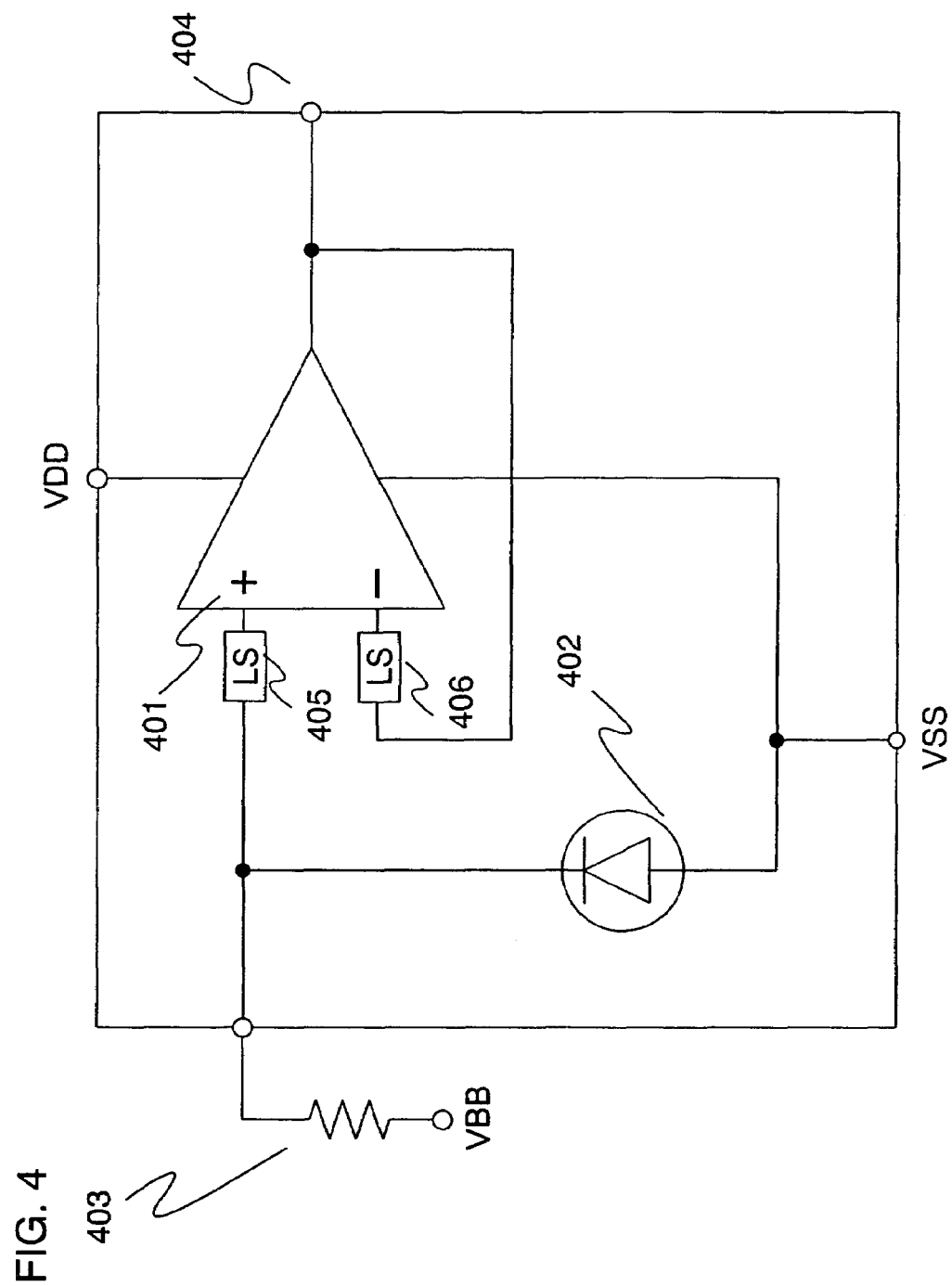
FIG. 4 is a diagram showing an embodiment mode of an optical sensor device of the invention.
Figure 5:
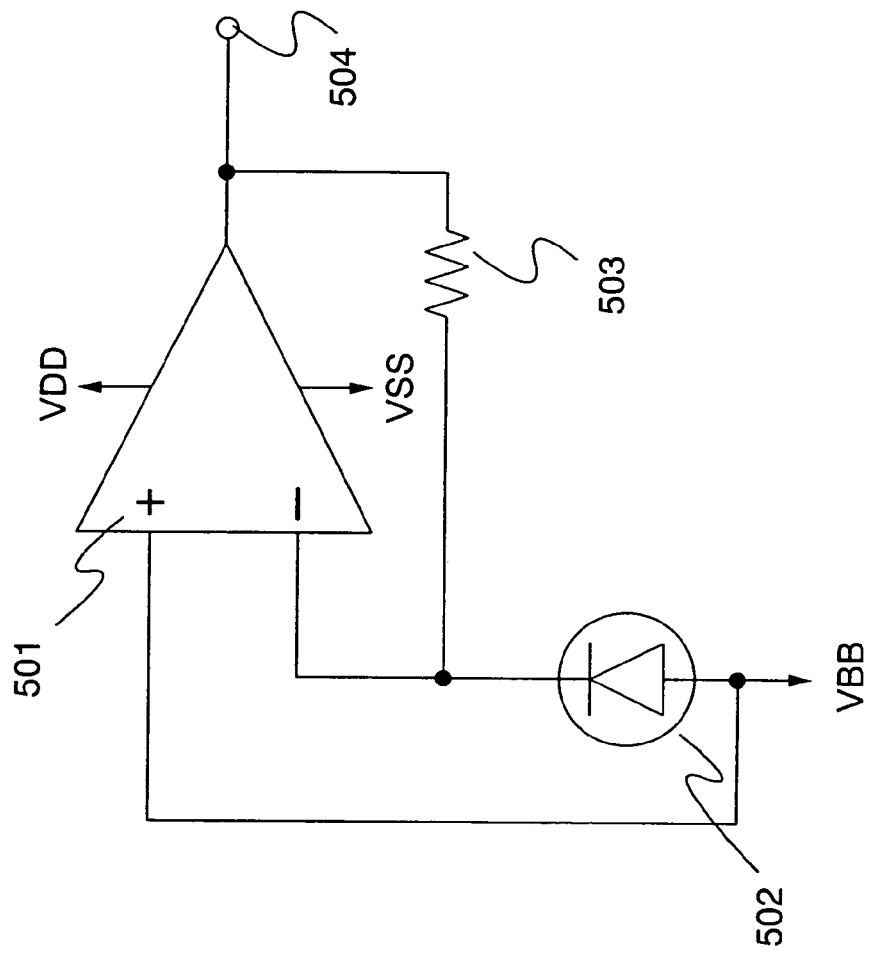
FIG. 5 is a diagram showing an embodiment mode of a conventional optical sensor device.

FIG. 4 shows the fourth embodiment mode of the invention. In this embodiment mode, an amplifier circuit 401 configured by a TFT, a photodiode 402, and level shift circuits 405 and 406 are formed integrally over a sensor substrate. An operation thereof is described below. An input of the level shift circuit 405 is connected to a first terminal of an I-V conversion resistor 403 and a second electrode of the photodiode 402 and an output thereof is connected to a non-inverting input terminal of the amplifier circuit 401. An input of the level shift circuit 406 is connected to an output terminal 404 and an output thereof is connected to an inverting input terminal of the amplifier circuit 401, so that the amplifier circuit 401 is a voltage follower. A first electrode of the photodiode 402 is connected to a low-potential-side power source VSS of the amplifier circuit 401. A second terminal of the I-V conversion resistor 403 is connected to an external power source VBB. Note that the I-V conversion resistor 403 is formed outside of the sensor substrate in order to reduce the fluctuation of an output voltage, however, the I-V conversion resistor 403 may be formed over the sensor substrate in the case where the fluctuation is within the acceptable range.

When light is inputted to the photodiode 402, optical current flows in the direction from the second electrode toward the first electrode of the photodiode 402. Consequently, current flows in the I-V conversion resister 403 and voltage is generated between both the terminals of the I-V conversion resistor 403.

That is, a potential equal to that of the VBB is outputted to the output terminal 404 in the case where no light is inputted and no current flows into the photodiode 402 whereas in the case where light is inputted and current flows into the photodiode 402, potential of the output terminal 404 drops in proportion to the amount of current.

Note that high driving capacity may be provided with the amplifier circuit 401 in this embodiment mode, therefore, an optical sensor circuit may drive a load connected to the output terminal 404.

Such a level shift circuit brings the following advantages.

FIGS. 6A to 6C are outward views of an integrated sensor chip 600. As shown in FIG. 6A, a photodiode portion 601 and an amplifier circuit portion 602 are formed on a top surface of the integrated sensor chip 600. As shown in a side view of FIG. 6B and a bottom view of FIG. 6C, an electrode for connection 605 is formed on a bottom surface of the integrated sensor chip 600. In view of strength, it is preferable that an electrode terminal for connection is formed at four points over such a sensor chip, then the sensor chip is mounted on a printed circuit board and the like. However, the aforementioned second embodiment mode does not conform to the above since the number of terminals is five.

Furthermore, the power source VBB2 is required in addition to the high-potential-side power source VDD, the low-potential-side power source VSS, and the external power source VBB1 in the second embodiment mode. The number of power sources can be reduced by means of a level shifter as shown in FIG. 4.

Note that the amplifier circuit 401 is an operational amplifier in this embodiment mode, however, the amplifier circuit 401 is not limited to the operational amplifier.

In addition, other optical sensor element may be employed as a substitute for the photodiode.

[Embodiment Mode 5]

Figure 19A:
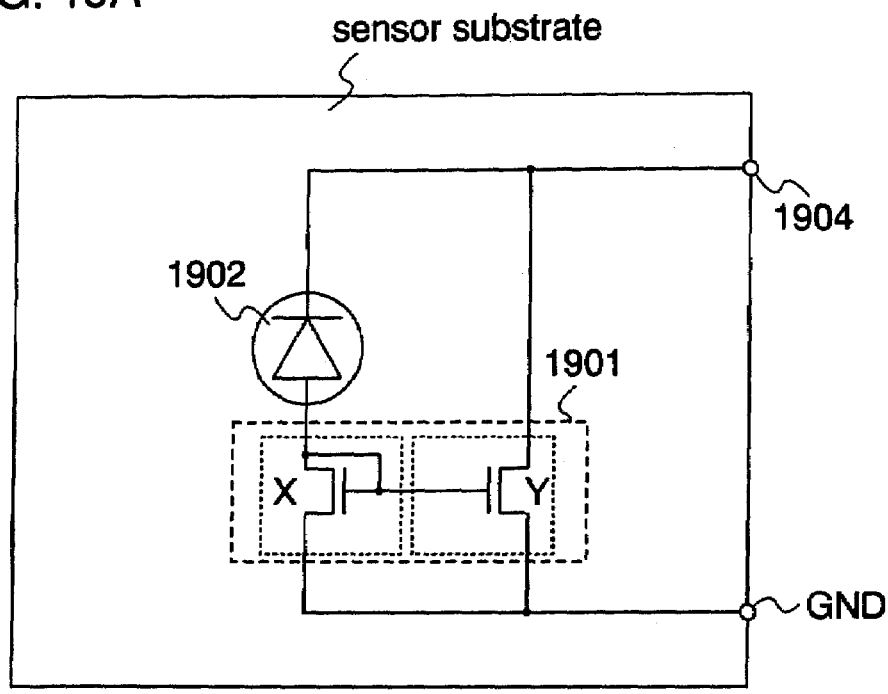
FIGS. 19A and 19B are diagrams showing an embodiment mode of an optical sensor device of the invention.
Figure 19B:
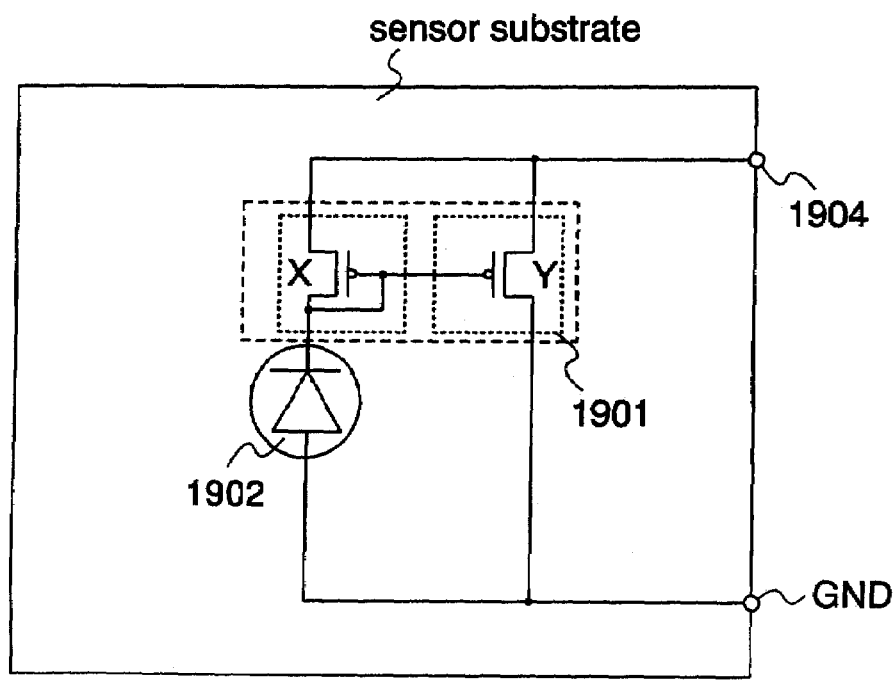

FIGS. 19A and 19B show the fifth embodiment mode of the invention. In this embodiment mode, an amplifier circuit 1901 configured by TFTs and a photodiode 1902 are formed integrally over a sensor substrate. An operation thereof is described below. Source regions of TFTs in the amplifier circuit 1901 are connected to an external power source GND. Drain regions of the Y-side TFT and the X-side TFT in the amplifier circuit 1901 are connected to an output terminal 1904 and a first electrode of the photodiode 1902, respectively. A second electrode of the photodiode 1902 is connected to the output terminal 1904.

When light is inputted to the photodiode 1902, optical current flows in the direction from the second electrode toward the first electrode of the photodiode 1902. Consequently, current flows into the X-side TFT in the amplifier circuit 1901, generating voltage for flowing the current at each gate thereof.

As for the X-side TFT and the Y-side TFT, when the number of TFTs connected in parallel, the gate length L, and the channel width W are equal to each other, the same amount of current flows into the X-side TFT and the Y-side TFT since respective gate voltages are equal to each other in a saturation region. For example, the number of the TFTs is determined so as to satisfy X-side:Y-side=1:n (assuming that other respective characteristics of the X-side TFT and the Y-side TFT are identical to each other), so that the amplification becomes n times as large. The desired amplification can be obtained in this manner.

FIG. 19A shows a circuit mounted with N-channel TFTs while FIG. 19B shows a circuit mounted with P-channel TFTs. An optical sensor circuit shown in FIG. 19B comprises the amplifier circuit 1901 and the photodiode 1902. A drain region of the Y-side TFT in the amplifier circuit 1901 is connected to the external power source GND and a source region thereof is connected to the output terminal 1904. A drain region of the X-side TFT in the amplifier circuit 1901 is connected to the second electrode of the photodiode 1902. The first electrode of the photodiode 1902 is connected to the GND. In this embodiment mode, other optical sensor element may be employed as a substitute for the photodiode.

[Embodiment Mode 6]

Figure 20A:
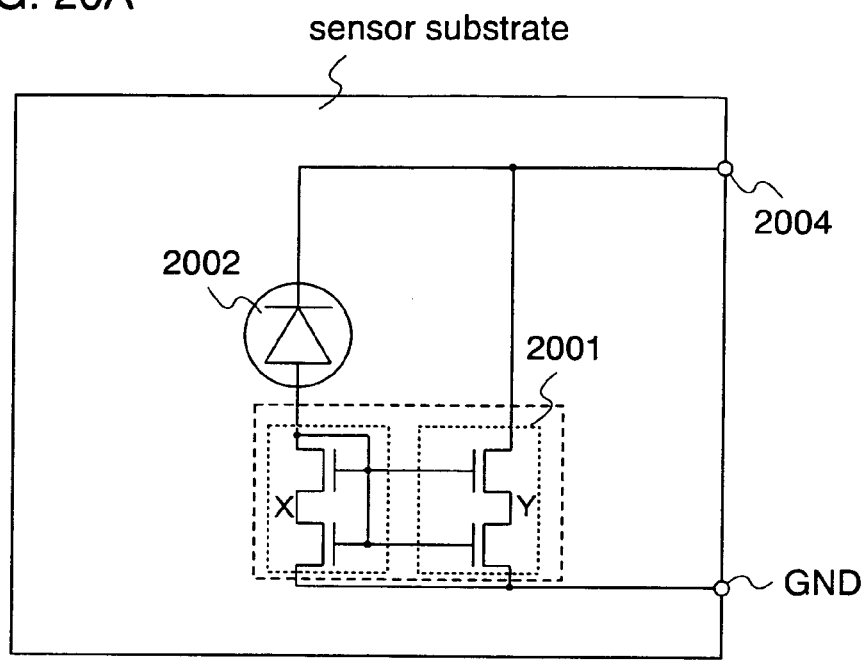
FIGS. 20A and 20B are diagrams showing an embodiment mode of an optical sensor device of the invention.
Figure 20B:
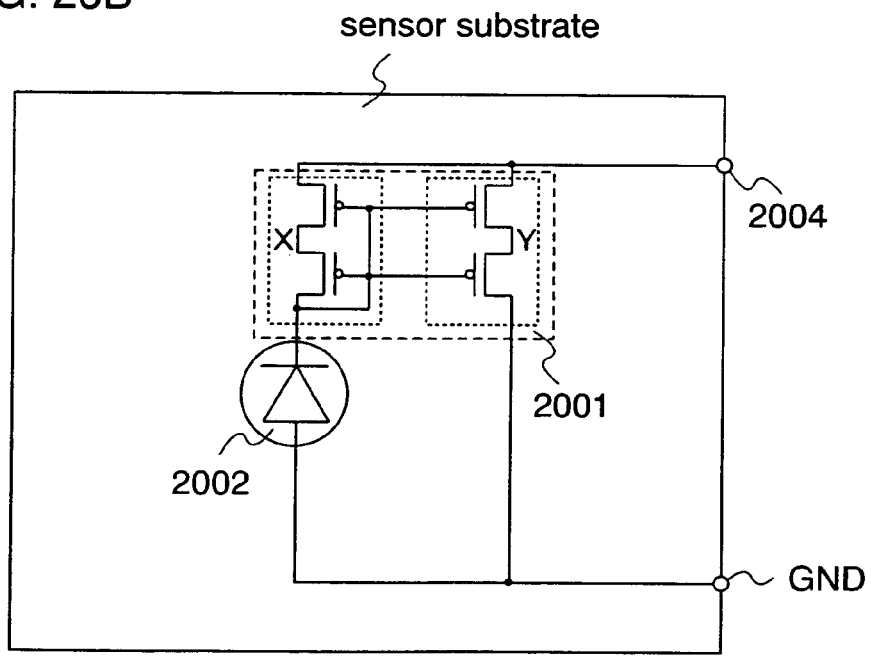

FIGS. 20A and 20B show the sixth embodiment mode of the invention. In this embodiment mode, an amplifier circuit 2001 configured by TFTs and a photodiode 2002 are formed integrally over a sensor substrate. An operation thereof is described below. As for TFTs in each of the X-side and the Y-side in the amplifier circuit 2001, they are disposed in series by connecting a source region and a drain region to each other and a multigate structure is formed by commonly connecting their gate electrodes. In addition, source regions of the TFTs at the low-voltage-side stage are connected to an external power source GND. Drain regions of the Y-side TFT and the X-side TFT at the high-voltage-side stage are connected to an output terminal 2004 and a first electrode of the photodiode 2002, respectively. A second electrode of the photodiode 2002 is connected to the output terminal 2004.

When light is inputted to the photodiode 2002, optical current flows in the direction from the second electrode toward the first electrode of the photodiode 2002. Consequently, current flows into the X-side TFTs in the amplifier circuit 2001, generating voltage for flowing the current at each gate thereof.

As for the X-side TFTs and the Y-side TFTs, when the number of TFTs connected in parallel, the gate length L, and the channel width W are equal to each other, the same amount of current flows into the X-side TFTs and the Y-side TFTs since respective gate voltages are equal to each other in a saturation region. For example, the number of the TFTs connected in parallel is determined so as to satisfy X-side:Y-side=1:n (assuming that other respective characteristics of the X-side TFT and the Y-side TFT are identical to each other), so that the amplification becomes n times as large. The desired amplification can be obtained in this manner.

Note that two stages of TFTs are connected in series to each other in the amplifier circuit 2001 in this embodiment mode, however, the number of stages is not limited to two. In addition, the characteristics of TFTs are not necessarily identical per stage, however, the relationship between the X-side and the Y-side has to be identical per stage.

FIG. 20A shows a circuit mounted with N-channel TFTs while FIG. 20B shows a circuit mounted with P-channel TFTs. In this embodiment mode, other optical sensor element may be employed as a substitute for the photodiode.

[Embodiment Mode 7]

Figure 21A:
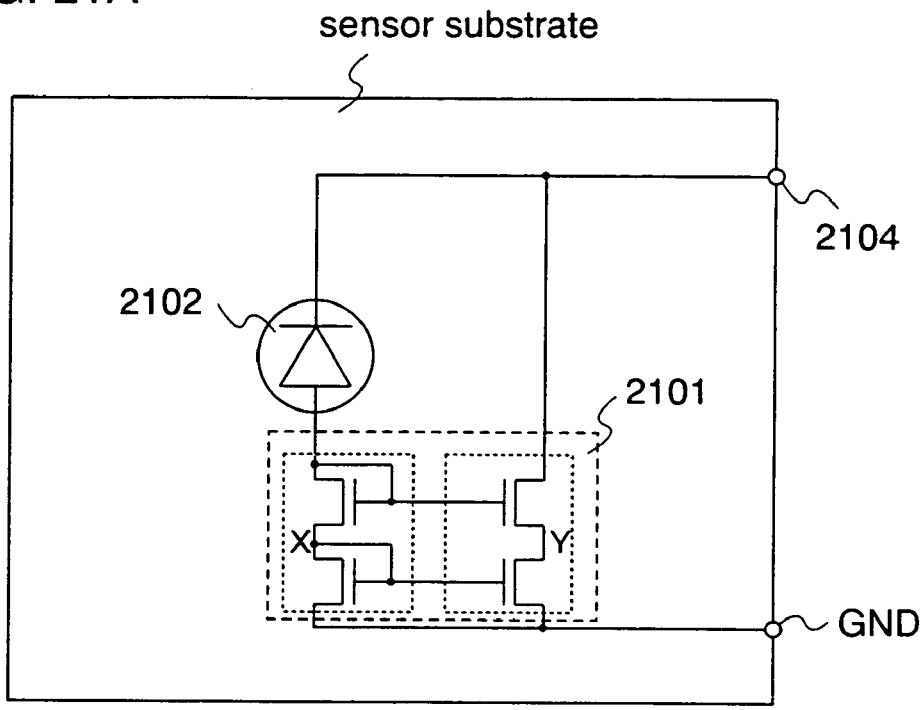
FIGS. 21A and 21B are diagrams showing an embodiment mode of an optical sensor device of the invention.
Figure 21B:
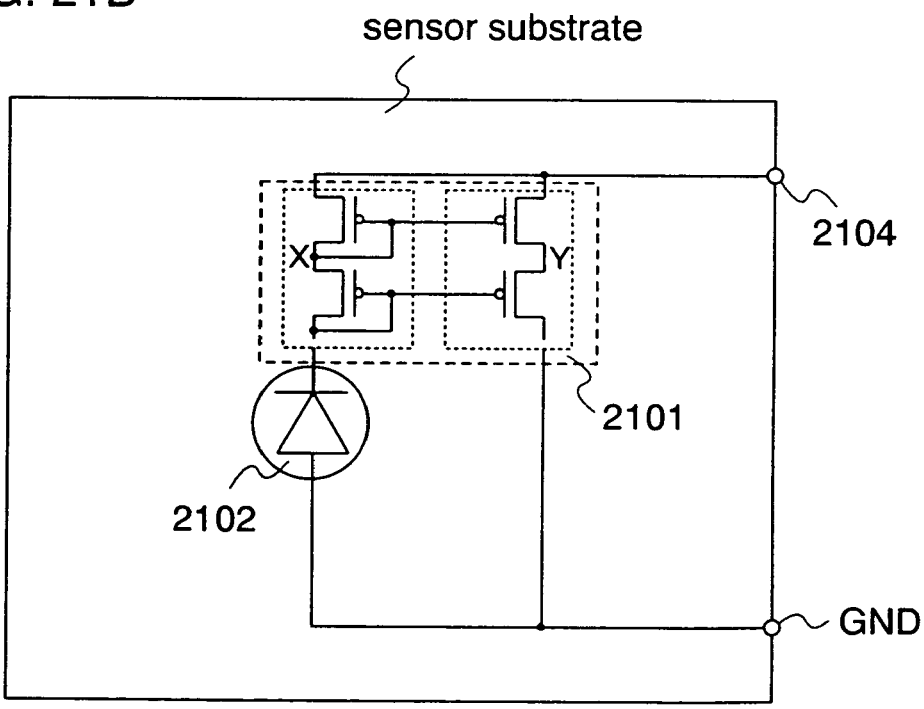

FIGS. 21A and 21B show the seventh embodiment mode of the invention. In this embodiment mode, an amplifier circuit 2101 configured by TFTs and a photodiode 2102 are formed integrally over a sensor substrate. An operation thereof is described below. As for TFTs in each of the X-side and the Y-side in the amplifier circuit 2101, they are disposed in series by connecting a source region and a drain region to each other. Gates of the X-side TFTs are diode-connected, which are then connected in series to each other. Gates of the Y-side TFTs are connected to the gates of the opposite X-side TFTs, respectively. In addition, source regions of TFTs at the low-voltage-side stage in the amplifier circuit 2101 are connected to an external power source GND. Drain regions of the Y-side TFT and the X-side TFT at the high-voltage-side stage are connected to an output terminal 2104 and a first electrode of the photodiode 2102, respectively. A second electrode of the photodiode 2102 is connected to the output terminal 2104.

When light is inputted to the photodiode 2102, optical current flows in the direction from the second electrode toward the first electrode of the photodiode 2102. Consequently, current flows into the X-side TFTs in the amplifier circuit 2101, generating voltage for flowing the current at each gate thereof.

As for the X-side TFTs and the Y-side TFTs, when the number of TFTs connected in parallel, the gate length L, and the channel width W are equal to each other, the same amount of current flows into the X-side TFTs and the Y-side TFTs since respective gate voltages are equal to each other per stage in a saturation region. For example, the number of the TFTs connected in parallel is determined so as to satisfy X-side:Y-side=1:n (assuming that other respective characteristics of the X-side TFT and the Y-side TFT are identical to each other), so that the amplification becomes n times as large. The desired amplification can be obtained in this manner.

Note that two stages of TFTs are connected in series to each other in the amplifier circuit 2101 in this embodiment mode, however, the number of stages is not limited to two. In addition, the characteristics of TFTs are not necessarily identical per stage, however, the relationship between the X-side and the Y-side has to be identical per stage.

FIG. 21A shows a circuit mounted with N-channel TFTs while FIG. 21B shows a circuit mounted with P-channel TFTs. In this embodiment mode, other optical sensor element may be employed as a substitute for the photodiode.

[Embodiment Mode 8]

Figure 22A:
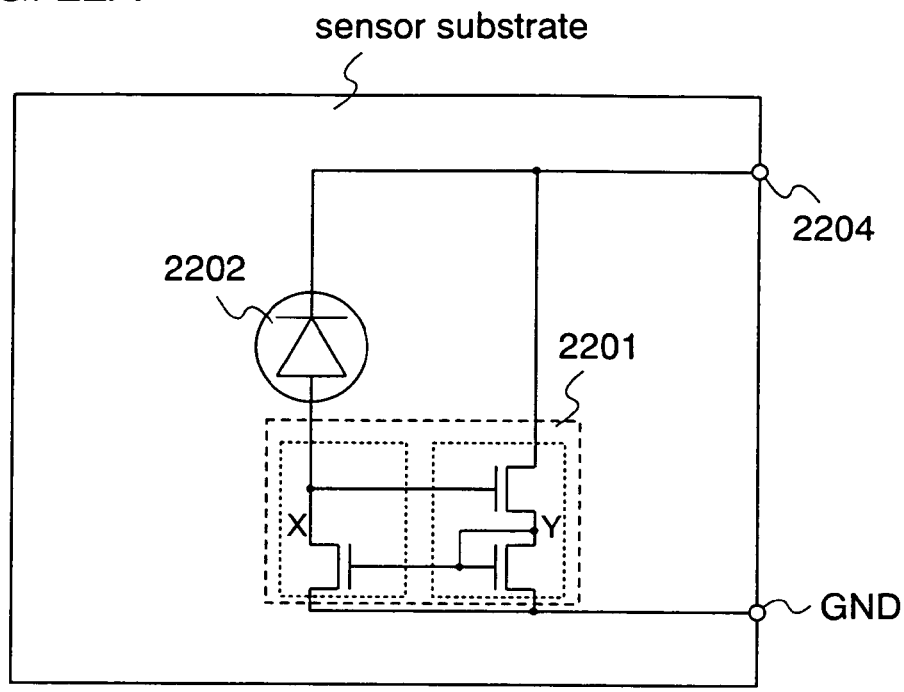
FIGS. 22A and 22B are diagrams showing an embodiment mode of an optical sensor device of the invention.
Figure 22B:
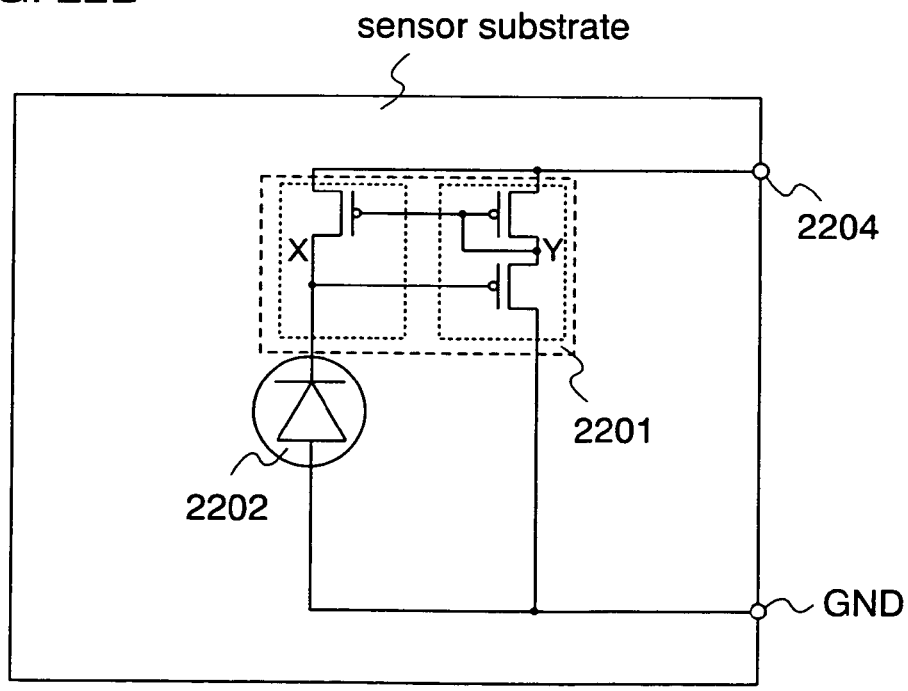

FIGS. 22A and 22B show the eighth embodiment mode of the invention. In this embodiment mode, an amplifier circuit 2201 configured by TFTs and a photodiode 2202 are formed integrally over a sensor substrate. An operation thereof is described below. The amplifier circuit 2201 is a Wilson current mirror circuit and source regions of TFTs at the low-voltage-side stage in the amplifier circuit 2201 are connected to an external power source GND. Drain regions of the Y-side TFT and the X-side TFT are connected to an output terminal 2204 and a first electrode of the photodiode 2202, respectively. A second electrode of the photodiode 2202 is connected to the output terminal 2204.

When light is inputted to the photodiode 2202, optical current flows in the direction from the second electrode toward the first electrode of the photodiode 2202. Consequently, current flows into the X-side TFT in the amplifier circuit 2201, generating voltage for flowing the current at each gate thereof.

As for the X-side TFT and the Y-side TFTs in the Wilson current mirror circuit, when the number of TFTs connected in parallel, the gate length L, and the channel width W are equal to each other, the same amount of current flows into the X-side TFT and the Y-side TFTs since respective gate voltages are equal to each other per stage in a saturation region. For example, the number of the TFTs connected in parallel is determined so as to satisfy X-side:Y-side=1:n (assuming that other respective characteristics of the X-side TFT land the Y-side TFT are identical to each other), so that the amplification becomes n times as large. The desired amplification can be obtained in this manner.

Note that two stages of TFTs are connected in series to each other in the amplifier circuit 2201 in this embodiment mode, however, the number of stages is not limited to two. In addition, the characteristics of TFTs are not necessarily identical per stage, however, the relationship between the X-side and the Y-side has to be identical per stage.

FIG. 22A shows a circuit mounted with N-channel TFTs while FIG. 22B shows a circuit mounted with P-channel TFTs. In this embodiment mode, other optical sensor element may be employed as a substitute for the photodiode.

[Embodiment Mode 9]

Figure 23A:
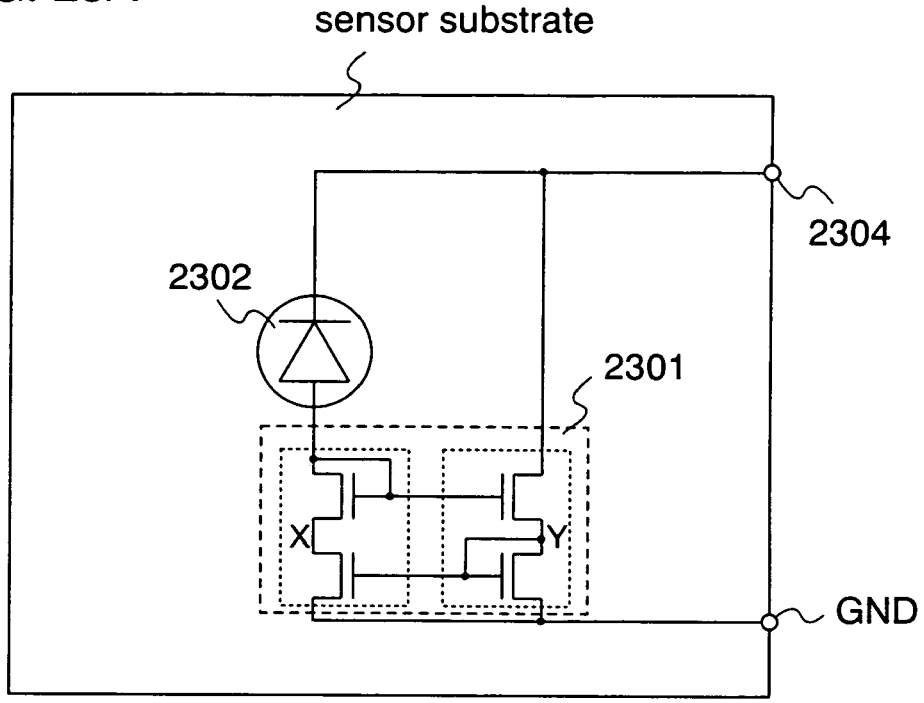
FIGS. 23A and 23B are diagrams showing an embodiment mode of an optical sensor device of the invention.
Figure 23B:
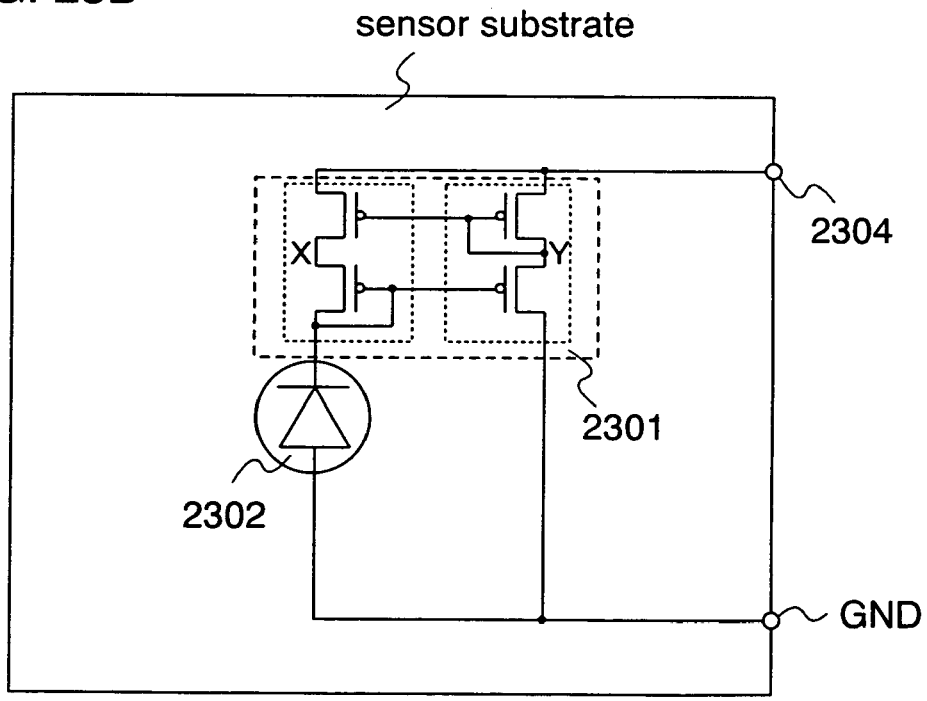

FIGS. 23A and 23B show the ninth embodiment mode of the invention. In this embodiment mode, an amplifier circuit 2301 configured by TFTs and a photodiode 2302 are formed integrally over a sensor substrate. An operation thereof is described below. The amplifier circuit 2301 is an improved Wilson current mirror circuit. In the improved Wilson current mirror circuit, the same number of TFTs are provided at the X-side and the Y-side, thereby each source-drain voltage of corresponding TFTs is equal to each other, so that the same amount of current flows into the X-side and the Y-side even when each TFT is a finite output resistor. The improved Wilson current mirror circuit is different from the Wilson current mirror circuit shown in FIGS. 22A and 22B in this point. Source regions of TFTs at the low-voltage-side stage in the amplifier circuit 2301 are connected to an external power source GND. Drain regions of the Y-side TFT and the X-side TFT are connected to an output terminal 2304 and a first electrode of the photodiode 2302, respectively. A second electrode of the photodiode 2302 is connected to the output terminal 2304.

When light is inputted to the photodiode 2302, optical current flows in the direction from the second electrode toward the first electrode of the photodiode 2302. Consequently, current flows into the X-side TFTs in the amplifier circuit 2301, generating voltage for flowing the current at each gate thereof.

As for the X-side TFTs and the Y-side TFTs, when the number of TFTs connected in parallel, the gate length L, and the channel width W are equal to each other, the same amount of current flows into the X-side TFTs and the Y-side TFTs since respective gate voltages are equal to each other per stage in a saturation region. For example, the number of the TFTs connected in parallel is determined so as to satisfy X-side:Y-side=1:n (assuming that other respective characteristics of the X-side TFT and the Y-side TFT are identical to each other), so that the amplification becomes n times as large. The desired amplification can be obtained in this manner.

Note that two stages of TFTs are connected in series to each other in the amplifier circuit 2301 in this embodiment mode, however, the number of stages is not limited to two. In addition, the characteristics of TFTs are not necessarily identical per stage, however, the relationship between the X-side and the Y-side has to be identical per stage.

FIG. 23A shows a circuit mounted with N-channel TFTs while FIG. 23B shows a circuit mounted with P-channel TFTs. In this embodiment mode, other optical sensor element may be employed as a substitute for the photodiode.

[Embodiment 1]

Figure 9:
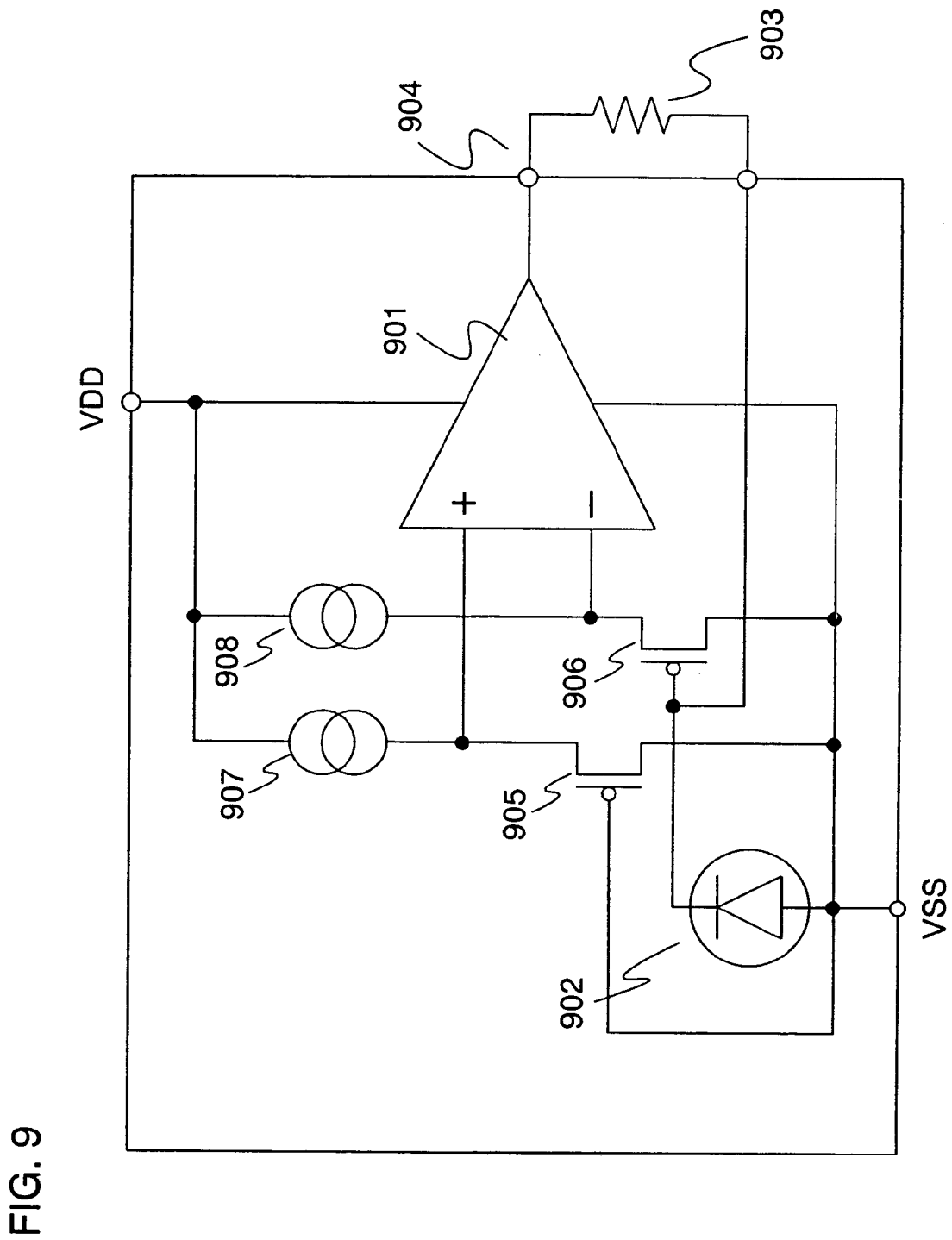
FIG. 9 is a diagram showing an embodiment of an optical sensor device of the invention.

FIG. 9 shows the first embodiment of the invention. This embodiment describes Embodiment Mode 3 employing a level shift circuit in detail. In this embodiment, an amplifier circuit 901 configured by a TFT, a photodiode 902, and two level shift circuits including P-channel TFTs 905 and 906 and constant current sources 907 and 908 are formed integrally over a sensor substrate. An operation thereof is described below. An input of the level shift circuit including the P-channel TFT 905 and the constant current source 907 is connected to a low-potential-side power source VSS and an output thereof is connected to a non-inverting input terminal of the amplifier circuit 901. An input of the level shift circuit including the P-channel TFT 906 and the constant current source 908 is connected to a second electrode of the photodiode 902 and the first terminal of a feedback resistor 903 and an output thereof is connected to an inverting input terminal of the amplifier circuit 901. A first electrode of the photodiode 902 is connected to the low-potential-side power source VSS. A second terminal of the feedback resistor 903 is connected to an output terminal 904 of the amplifier circuit 901. Note that the feedback resistor 903 is formed outside of the sensor substrate in order to reduce the fluctuation of an output voltage of the amplifier circuit 901, however, the feedback resistor 903 may be formed over the sensor substrate in the case where the fluctuation is within the acceptable range.

When light is inputted to the photodiode 902, optical current flows in the direction from the second electrode toward the first electrode of the photodiode 902. Consequently, current flows through the output terminal 904 of the amplifier circuit 901 toward the feedback resistor 903, generating voltage between both the terminals of the feedback resistor 903.

High driving capacity may be provided with the amplifier circuit 901 in this embodiment, therefore, an optical sensor circuit may drive a load connected to the output terminal 904.

In this embodiment, an electrode terminal for connection of the optical sensor device can be formed at four points, namely a high-potential-side power source VDD, the low-potential-side power source VSS, the output terminal 904 of the amplifier circuit 901, and a connecting terminal between the feedback resistor 903 and the photodiode 902, so that the aforementioned mounting strength can be improved. In addition, the number of power sources can be reduced to two by means of a level shifter.

Note that the amplifier circuit 901 is an operational amplifier in this embodiment, however, the amplifier circuit 901 is not limited to the operational amplifier.

In addition, other optical sensor element may be employed as a substitute for the photodiode.

[Embodiment 2]

Figure 10:
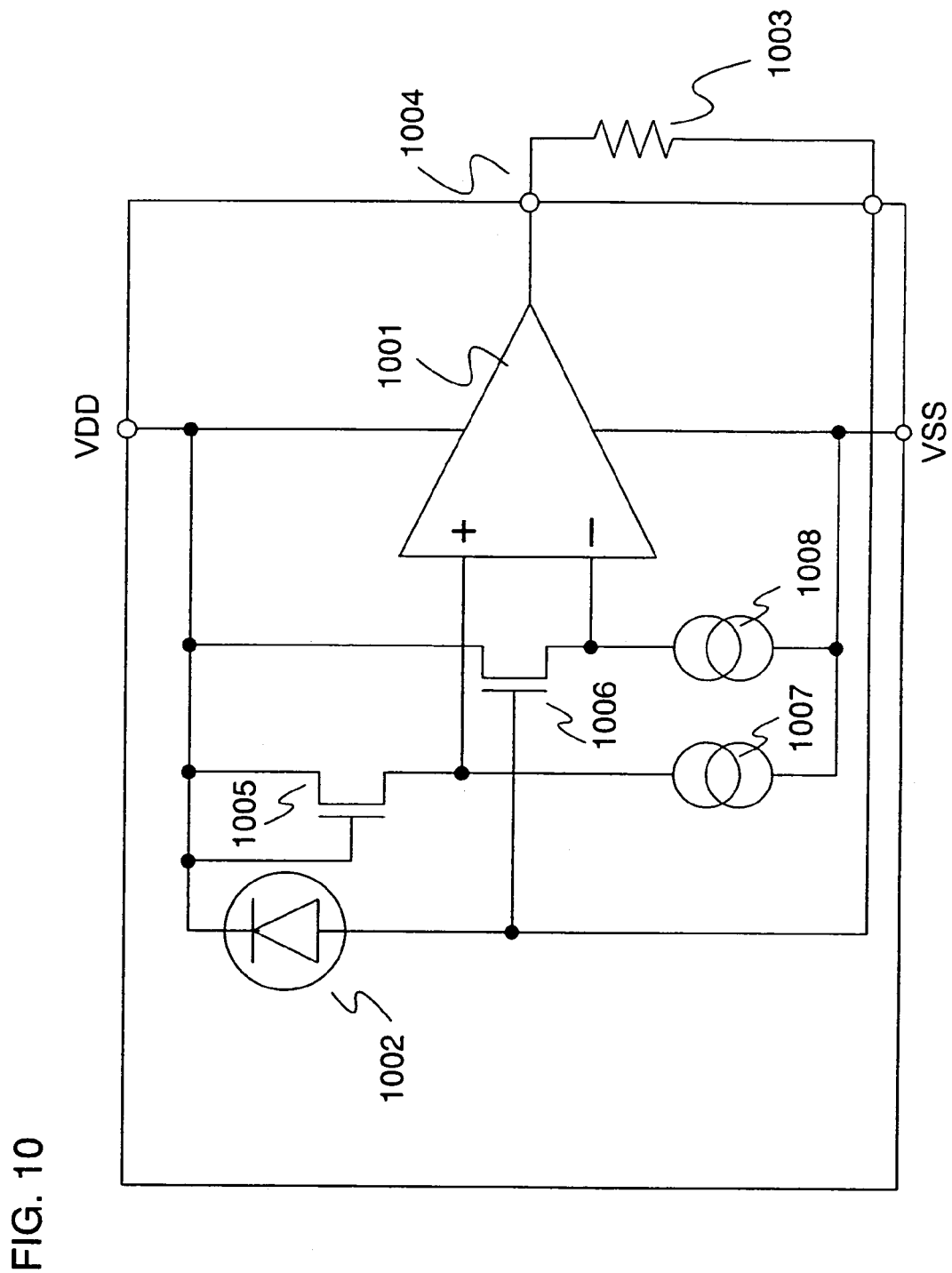
FIG. 10 is a diagram showing an embodiment of an optical sensor device of the invention.

FIG. 10 shows the second embodiment of the invention. This embodiment describes Embodiment Mode 3 employing a level shift circuit in detail. In this embodiment, an amplifier circuit 1001 configured by a TFT, a photodiode 1002, and two level shift circuits including N-channel TFTs 1005 and 1006 and constant current sources 1007 and 1008 are formed integrally over a sensor substrate. An operation thereof is described below. An input of the level shift circuit including the N-channel TFT 1005 and the constant current source 1007 is connected to a high-potential-side power source VDD and an output thereof is connected to a non-inverting input terminal of the amplifier circuit 1001. An input of the level shift circuit including the N-channel TFT 1006 and the constant current source 1008 is connected to a first electrode of the photodiode 1002 and a first terminal of a feedback resistor 1003 and an output thereof is connected to an inverting input terminal of the amplifier circuit 1001. A second electrode of the photodiode 1002 is connected to the high-potential-side power source VDD. The second terminal of the feedback resistor 1003 is connected to an output terminal 1004 of the amplifier circuit 1001. Note that the feedback resistor 1003 is formed outside of the sensor substrate in order to reduce the fluctuation of an output voltage of the amplifier circuit 1001, however, the feedback resistor 1003 may be formed over the sensor substrate in the case where the fluctuation is within the acceptable range.

When light is inputted to the photodiode 1002, optical current flows in the direction from the second electrode toward the first electrode of the photodiode 1002. Consequently, current flows through the feedback resistor 1003 toward the output terminal 1004 of the amplifier circuit 1001, generating voltage between both the terminals of the feedback resistor 1003.

High driving capacity may be provided with the amplifier circuit 1001 in this embodiment, therefore, an optical sensor circuit may drive a load connected to the output terminal 1004.

In this embodiment, an electrode terminal for connection of the optical sensor device can be formed at four points, namely the high-potential-side power source VDD, a low-potential-side power source VSS, the output terminal 1004 of the amplifier circuit 1001, and a connecting terminal between the feedback resistor 1003 and the photodiode 1002, so that the aforementioned mounting strength can be improved. In addition, the number of power sources can be reduced to two by means of a level shifter.

Note that the amplifier circuit 1001 is an operational amplifier in this embodiment, however, the amplifier circuit 1001 is not limited to the operational amplifier.

In addition, other optical sensor element may be employed as a substitute for the photodiode 1002.

[Embodiment 3]

Figure 11:
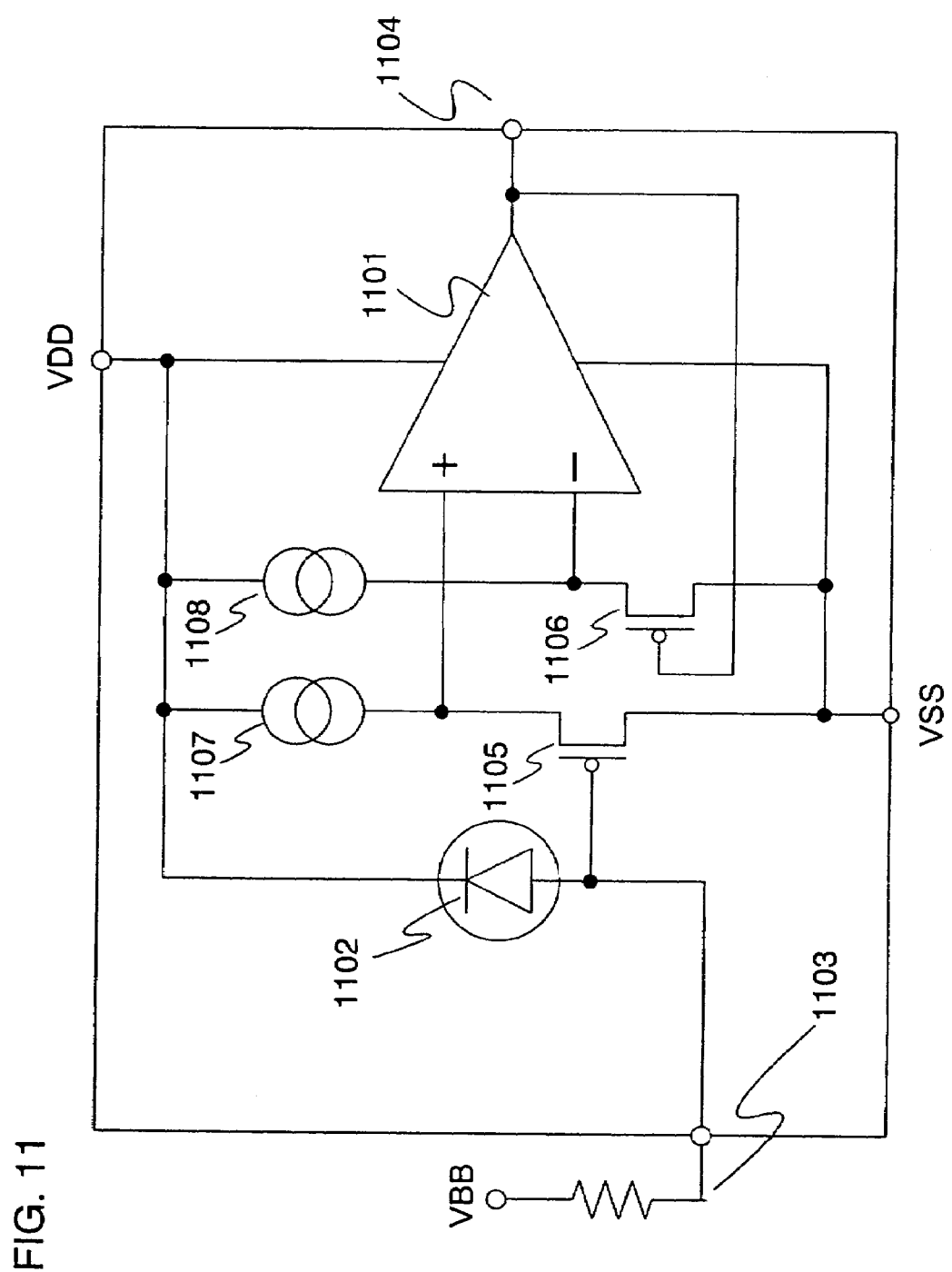
FIG. 11 is a diagram showing an embodiment of an optical sensor device of the invention.

FIG. 11 shows the third embodiment of the invention. This embodiment describes Embodiment Mode 4 in detail. In this embodiment, an amplifier circuit 1101 configured by a TFT, a photodiode 1102, and two level shift circuits including TFTs 1105 and 1106 and constant current sources 1107 and 1108 are formed integrally over a sensor substrate. An operation thereof is described below. An input of the level shift circuit including the P-channel TFT 1105 and the constant current source 1107 is connected to a first electrode of the photodiode 1102 and a first terminal of an I-V conversion resistor 1103 and an output thereof is connected to a non-inverting input terminal of the amplifier circuit 1101. An input of the level shift circuit including the P-channel TFT 1106 and the constant current source 1108 is connected to an output terminal 1104 of the amplifier circuit 1101 and an output thereof is connected to an inverting input terminal of the amplifier circuit 1101, so that the amplifier circuit 1101 is a voltage follower. A second electrode of the photodiode 1102 is connected to a high-potential-side power source VDD. A second terminal of the I-V conversion resistor 1103 is connected to an external power source VBB.

Note that the I-V conversion resistor 1103 is formed outside of the sensor substrate in order to reduce the fluctuation of an output voltage, however, the I-V conversion resistor 1103 may be formed over the sensor substrate in the case where the fluctuation is within the acceptable range.

When light is inputted to the photodiode 1102, optical current flows in the direction from the second electrode toward the first electrode of the photodiode 1102. Consequently, current flows into the I-V conversion resistor 1103, generating voltage between both the terminals of the I-V conversion resistor 1103.

That is, a potential equal to that of the VBB is outputted to the output terminal 1104 in the case where no light is inputted and no current flows into the photodiode 1102 whereas in the case where light is inputted and current flows into the photodiode 1102, the potential of the output terminal 1104 rises in proportion to the amount of current.

High driving capacity may be provided with the amplifier circuit 1101 in this embodiment, therefore, an optical sensor circuit may drive a load connected to the output terminal 1104.

In this embodiment, an electrode terminal for connection of the optical sensor device can be formed at four points, namely the high-potential-side power source VDD, a low-potential-side power source VSS, the output terminal 1104 of the amplifier circuit 1101, and a connecting terminal between the I-V conversion resistor 1103 and the photodiode 1102, so that the aforementioned mounting strength can be improved. In addition, the number of power sources can be reduced to two by means of a level shifter.

Note that the amplifier circuit 1101 is an operational amplifier in this embodiment, however, the amplifier circuit 1101 is not limited to the operational amplifier.

In addition, other optical sensor element may be employed as a substitute for the photodiode.

[Embodiment 4]

Figure 12:
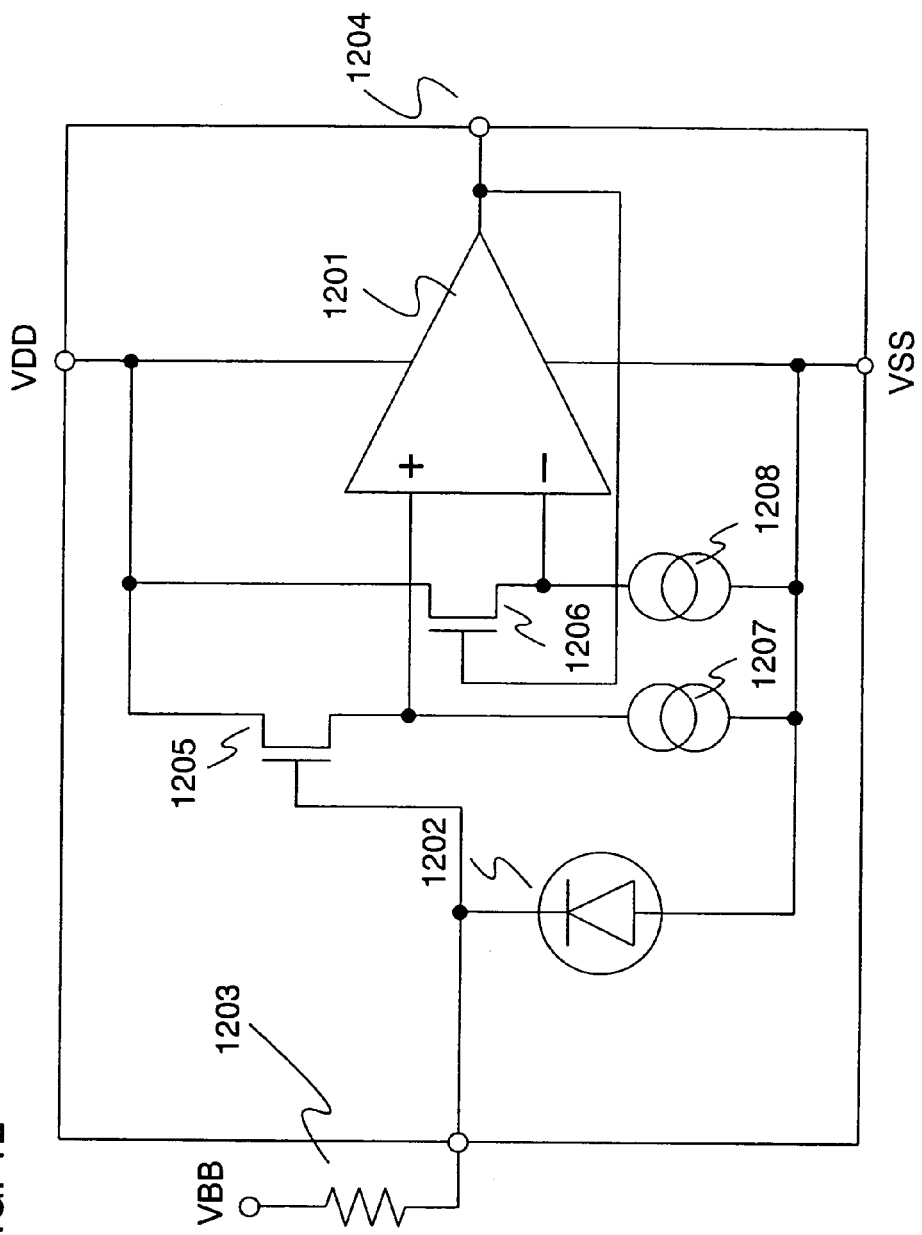
FIG. 12 is a diagram showing an embodiment of an optical sensor device of the invention.
Figure 13:
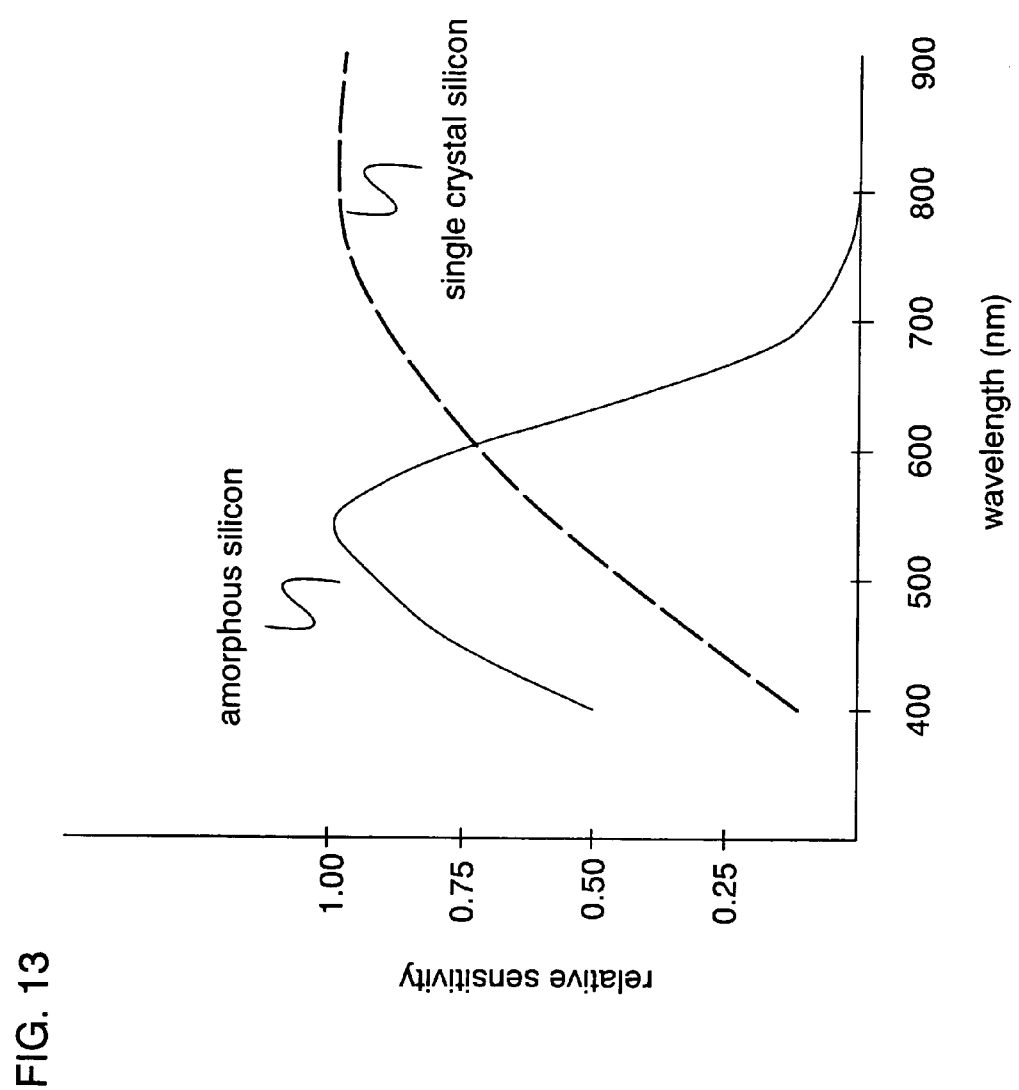
FIG. 13 is a graph showing sensitive characteristics of photodiodes.

FIG. 12 shows the fourth embodiment of the invention. This embodiment describes Embodiment Mode 4 in detail. In this embodiment, an amplifier circuit 1201 configured by a TFT, a photodiode 1202, and two level shift circuits including TFTs 1205 and 1206 and constant current sources 1207 and 1208 are formed integrally over a sensor substrate. An operation thereof is described below. An input of the level shift circuit including the N-channel TFT 1205 and the constant current source 1207 is connected to a second electrode of the photodiode 1202 and a first terminal of an I-V conversion resistor 1203 and an output thereof is connected to a non-inverting input terminal of the amplifier circuit 1201. An input of the level shift circuit including the N-channel TFT 1206 and the constant current source 1208 is connected to an output terminal 1204 of the amplifier circuit 1201 and an output thereof is connected to an inverting input terminal of the amplifier circuit 1201, so that the amplifier circuit 1201 is a voltage follower. A first electrode of the photodiode 1202 is connected to a low-potential-side power source VSS. A second terminal of the I-V conversion resistor 1203 is connected to an external power source VBB. Note that the I-V conversion resistor 1203 is formed outside of the sensor substrate in order to reduce the fluctuation of an output voltage, however, the I-V conversion resistor 1203 may be formed over the sensor substrate in the case where the fluctuation is within the acceptable range.

When light is inputted to the photodiode 1202, optical current flows in the direction from the second electrode toward the first electrode of the photodiode 1202. Consequently, current flows into the I-V conversion resistor 1203, generating voltage between both the terminals of the I-V conversion resistor 1203.

That is, a potential equal to that of the VBB is outputted to the output terminal 1204 in the case where no light is inputted and no current flows into the photodiode 1202 whereas in the case where light is inputted and current flows into the photodiode 1202, potential of the output terminal 1204 drops in proportion to the amount of current.

High driving capacity may be provided with the amplifier circuit 1201 in this embodiment, therefore, an optical sensor circuit may drive a load connected to the output terminal 1204.

In this embodiment, an electrode terminal for connection of the optical sensor device can be formed at four points, namely the high-potential-side power source VDD, the low-potential-side power source VSS, the output terminal 1204 of the amplifier circuit 1201, and a connecting terminal between the I-V conversion resistor 1203 and the photodiode 1202, so that the aforementioned mounting strength can be improved. In addition, the number of power sources can be reduced to two by means of a level shifter.

Note that the amplifier circuit 1201 is an operational amplifier in this embodiment, however, the amplifier circuit 1201 is not limited to the operational amplifier.

In addition, other optical sensor element may be employed as a substitute for the photodiode.

[Embodiment 5]

Figure 14:
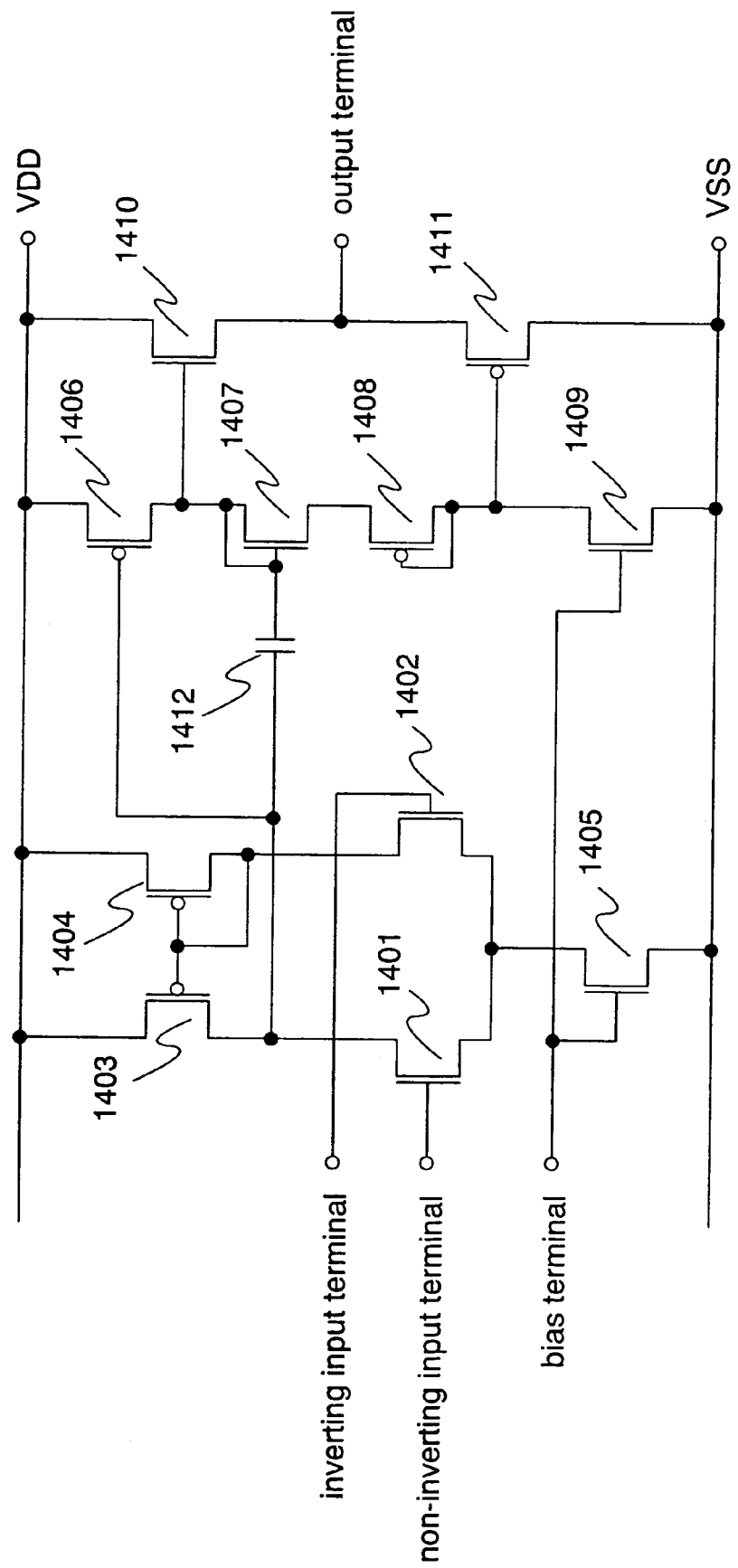
FIG. 14 is a diagram showing an equivalent circuit of an amplifier circuit adopted in the invention.

FIG. 14 is an equivalent circuit diagram of an amplifier circuit, in particular, an operational amplifier circuit configured by a thin film semiconductor element, in particular, a TFT. The operational amplifier comprises a differential circuit including TFTs 1401 and 1402, a current mirror circuit including TFTs 1403 and 1404, a constant current source including TFTs 1405 and 1409, a common source circuit including a TFT 1406, an idling circuit including TFTs 1407 and 1408, a source follower circuit including TFTs 1410 and 1411, and a phase compensation capacitor 1412.

An operation of the operational amplifier circuit in FIG. 14 is explained below. When a positive signal is inputted to a non-inverting input terminal, drain current of the TFT 1401 becomes larger than that of the TFT 1402 since the constant current source including the TFT 1405 is connected to sources of the TFTs 1401 and 1402 in the differential circuit. Drain current of the TFT 1403 becomes equal to that of the TFT 1402 since the TFTs 1404 and 1403 configure the current mirror circuit. Consequently, a drain current difference between the TFT 1403 and the TFT 1401 causes gate potential of the TFT 1406 to drop. The TFT 1406 is a P-channel TFT, therefore, it is turned ON and the amount of drain current thereof increases as the gate potential drops. Consequently, gate potential of the TFT 1410 rises, and according to this, source potential of the TFT 1410, namely potential of an output terminal rises.

When a negative signal is inputted to the non-inverting input terminal, drain current of the TFT 1401 becomes smaller than that of the TFT 1402 while drain current of the TFT 1403 is equal to that of the TFT 1402. Consequently, a drain current difference between the TFT 1403 and the TFT 1401 causes gate potential of the TFT 1406 to rise. The TFT 1406 is a P-channel TFT, therefore, it is turned OFF and the amount of drain current thereof decreases as the gate potential rises. Consequently, gate potential of the TFT 1410 drops, and according to this, source potential of the TFT 1410, namely potential of the output terminal drops. A signal having the same phase as that of a signal of a non-inverting input terminal is outputted from the output terminal in this manner.

When a positive signal is inputted to an inverting input terminal, drain current of the TFT 1401 becomes smaller than that of the TFT 1402 while drain current of the TFT 1403 is equal to that of the TFT 1402. Consequently, a drain current difference between the TFT 1403 and the TFT 1401 causes gate potential of the TFT 1406 to rise. The TFT 1406 is a P-channel TFT, therefore, it is turned OFF and the amount of drain current thereof decreases as the gate potential rises. Consequently, gate potential of the TFT 1410 drops, and according to this, source potential of the TFT 1410, namely potential of the output terminal drops.

When a negative signal is inputted to the inverting input terminal, drain current of the TFT 1401 becomes larger than that of the TFT 1402 while drain current of the TFT 1403 is equal to that of the TFT 1402. Consequently, a drain current difference between the TFT 1403 and the TFT 1401 causes gate potential of the TFT 1406 to drop. The TFT 1406 is a P-channel TFT, therefore, it is turned ON and the amount of drain current thereof increases as the gate potential drops. Consequently, gate potential of the TFT 1410 rises, and according to this, source potential of the TFT 1410, namely potential of the output terminal rises. A signal having the reverse phase to that of an inverting input terminal is outputted from the output terminal in this manner.

In this embodiment, the differential circuit and the current mirror circuit are configured by N-channel TFTs and P-channel TFTs, respectively. However, the invention is not limited to this and polarities of these circuits may be reversed. In addition, a circuit configuration of the amplifier circuit is not limited to the above either so long as it has a function of an amplifier circuit.

This embodiment may be freely combined with the aforementioned embodiment modes and embodiments.

[Embodiment 6]

Figure 17:
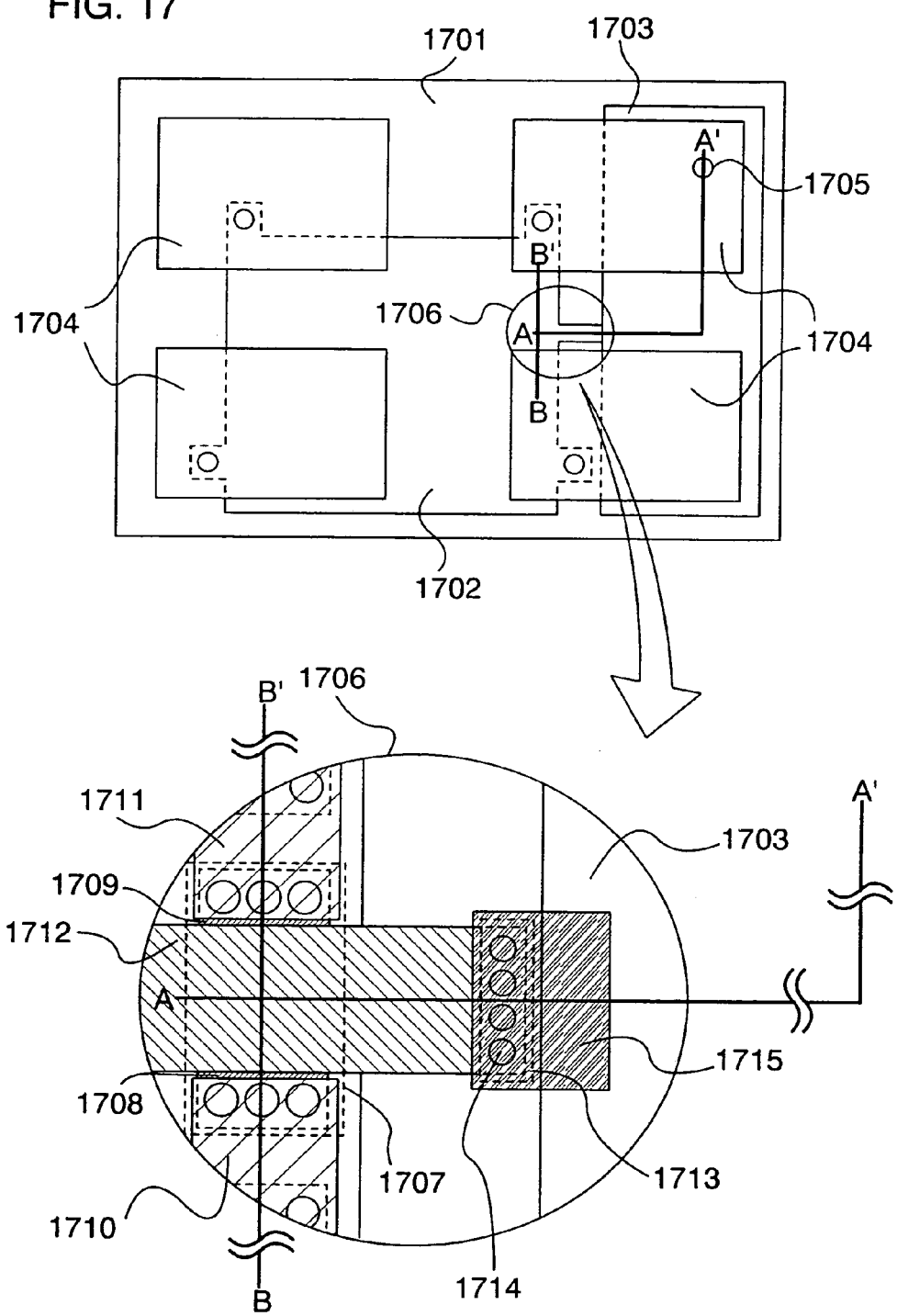
FIG. 17 is a diagram showing an example of a structure of an optical sensor device of the invention.

An example of a structure of an optical sensor device of the invention is described below. FIG. 17 shows an optical sensor device in which a photodiode and an amplifier circuit are formed integrally. This figure is seen from a side for mounting the optical sensor device to a printed circuit board.

An amplifier circuit 1702 and a photodiode 1703 are formed over a substrate 1701, and an electrode terminal for connection 1704 is formed thereon. The electrode terminal for connection 1704 is connected to the amplifier circuit 1702 and the photodiode 1703 through a contact hole 1705.

An enlarged view of a portion 1706 in which the amplifier circuit 1702 and the photodiode 1703 are connected is shown using a line. A TFT 1707 comprises source and drain regions 1708 and 1709, a channel forming region (not shown), source and drain electrodes 1710 and 1711, and a gate electrode 1712.

Over the gate electrode 1712, an interlayer insulating film (not shown) is formed, and a wiring 1713 is formed thereon to be connected to the gate electrode 1712 through a contact hole 1714. A first electrode 1715 of the photodiode 1703 is formed over the wiring 1713.

FIG. 18A is a cross-sectional view of the optical sensor device in which the photodiode 1703 and the amplifier circuit 1702 are formed integrally. The electrical connection between the TFT 1707 of the amplifier circuit 1702 and the photodiode 1703 is described next in more detail with reference to FIG. 18A. FIG. 18A is a cross-sectional view along a line A—A', in which an identical portion to FIG. 17 is denoted by the same reference numeral. A base insulating film 1801 is formed on the substrate 1701, and the TFT 1707 and the photodiode 1703 are formed over the base insulating film 1801.

A semiconductor layer 1802 corresponds to the channel forming region. The source and drain regions 1708 and 1709 are formed on the frontside and the backside of the channel forming region in the figure. A gate insulating film 1803, the gate electrode 1712, a first interlayer insulating film 1804, and a second interlayer insulating film 1805 are formed on the semiconductor layer 1802 in this order.

The gate electrode 1712 of the TFT 1707 is connected to the first electrode 1715 of the photodiode 1703 through the contact hole 1714 by the wiring 1713.

A P-type semiconductor layer 1806 is formed so as to contact with the first electrode 1715 of the photodiode 1703. A photoelectric conversion layer 1807, an N-type semiconductor layer 1808, and a second electrode 1809 of the photodiode 1703 are formed on the P-type semiconductor layer 1806 in this order. A third interlayer insulating film 1810 is formed on the second electrode 1809 of the photodiode 1703 and the second electrode 1809 is connected to the electrode terminal for connection 1704 through the contact hole 1705.

A material having light translucency and conductivity such as ITO (Indium Tin Oxide) is preferably used for the first electrode 1715 of the photodiode 1703 in order to prevent the incident light to the photodiode 1703 from being shielded. In addition, a material having light reflectivity such as Ti is preferably used for the second electrode 1809 of the photodiode 1703, so that light passing through the photoelectric conversion layer 1807 and the N-type semiconductor layer 1808 without being absorbed into the photoelectric conversion layer 1807 among the incident light from the P-type semiconductor layer 1806 is reflected to be absorbed into the photoelectric conversion layer 1807. The P-type semiconductor layer 1806 can be formed by a P-type amorphous silicon film (a-Si:H) or a P-type microcrystal semiconductor (μc-Si:H), the photoelectric conversion layer 1807 can be formed by an amorphous silicon film (a-Si:H), and the N-type semiconductor layer 1808 can be formed by an N-type amorphous silicon film (a-Si:H) or an N-type microcrystal semiconductor (μc-Si:H)

FIG. 18B is a cross-sectional view along a line B—B' in FIG. 17, which is seen from the A side of a line A—A' and the third interlayer insulating film 1810 which is assumed to transmit light.

The TFT 1707 comprises the semiconductor layer 1802, the source and drain regions 1708 and 1709, the source and drain electrodes 1710 and 1711, and the gate electrode 1712. The gate electrode 1712 extends to the backside of the figure to be connected to the first electrode 1715 of the photodiode 1703 through the contact hole 1714 by the wiring 1713. The P-type semiconductor layer 1806 is formed so as to contact with the first electrode 1715 of the photodiode 1703. The photoelectric conversion layer 1807, the N-type semiconductor layer 1808, and the second electrode 1809 of the photodiode 1703 are formed on the P-type semiconductor layer 1806 in this order. Furthermore, the third interlayer insulating film 1810 and the electrode terminal for connection 1704 are formed on the second electrode 1809 of the photodiode 1703. The electrode terminal for connection 1704 is connected to the second electrode 1809 of the photodiode 1703 through a contact hole (not shown).

Note that the invention is not limited to the structure of the optical sensor device described in Embodiment 6. For example, the amplifier circuit 1702 may be a current mirror circuit instead of the operational amplifier. In addition, the optical sensor element is not limited to the above structure and may be a polysilicon photodiode. Other optical sensor element may be employed as a substitute for the photodiode.

[Embodiment 7]

Figure 24A:
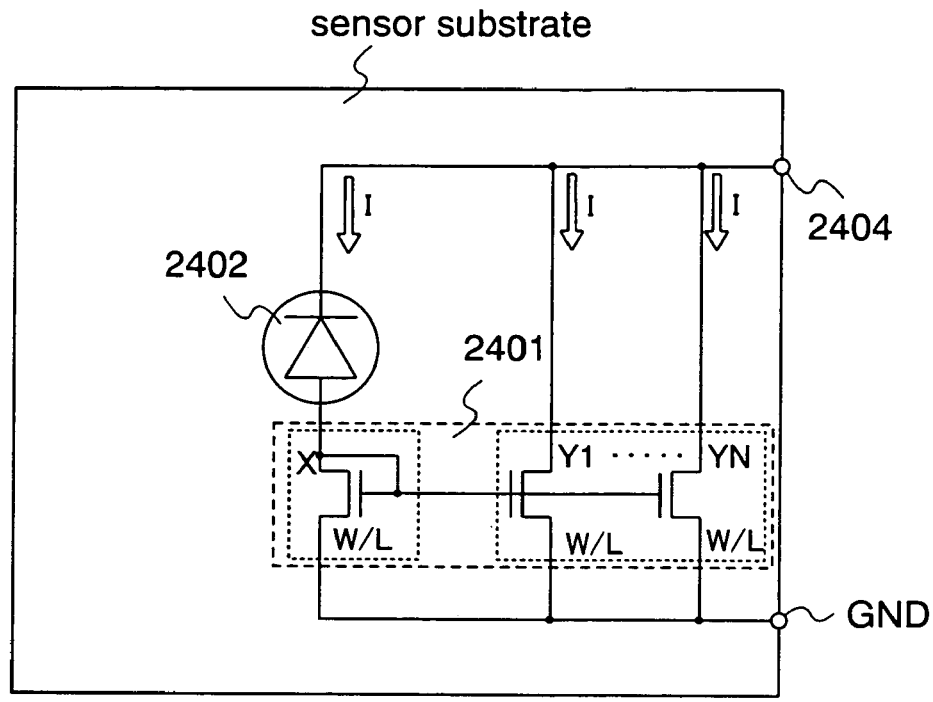
FIGS. 24A and 24B are diagrams showing an embodiment of an optical sensor device of the invention.

FIG. 24A shows the seventh embodiment of the invention. This embodiment describes Embodiment Mode 5 in detail.

In this embodiment, an amplifier circuit 2401 configured by a TFT and a photodiode 2402 are formed integrally over a sensor substrate. An operation thereof is described below. Source regions of TFTs in the amplifier circuit 2401 are connected to an external power source GND. The Y-side TFTs have N columns of parallel connections and drain regions thereof are connected to an output terminal 2404. Drain region of the X-side TFT in the amplifier circuit 2401 is connected to a first electrode of the photodiode 2402. A second electrode of the photodiode 2402 is connected to the output terminal 2404.

When light is inputted to the photodiode 2402, optical current I flows in the direction from the second electrode toward the first electrode of the photodiode 2402. Consequently, current I flows into the X-side TFT in the amplifier circuit 2401, generating voltage for flowing the current I at each gate thereof.

As for the X-side TFT and the Y-side TFTs, since the gate length L and the channel width W are equal to each other and each gate of the Y-side TFTs is connected to the gate of the X-side TFT, the current I flows into each column of the Y-side TFTs. Accordingly, when the optical current I flows into the photodiode 2402, the amount of current flowing into the output terminal 2404 becomes (1+N)*I.

Figure 24B:
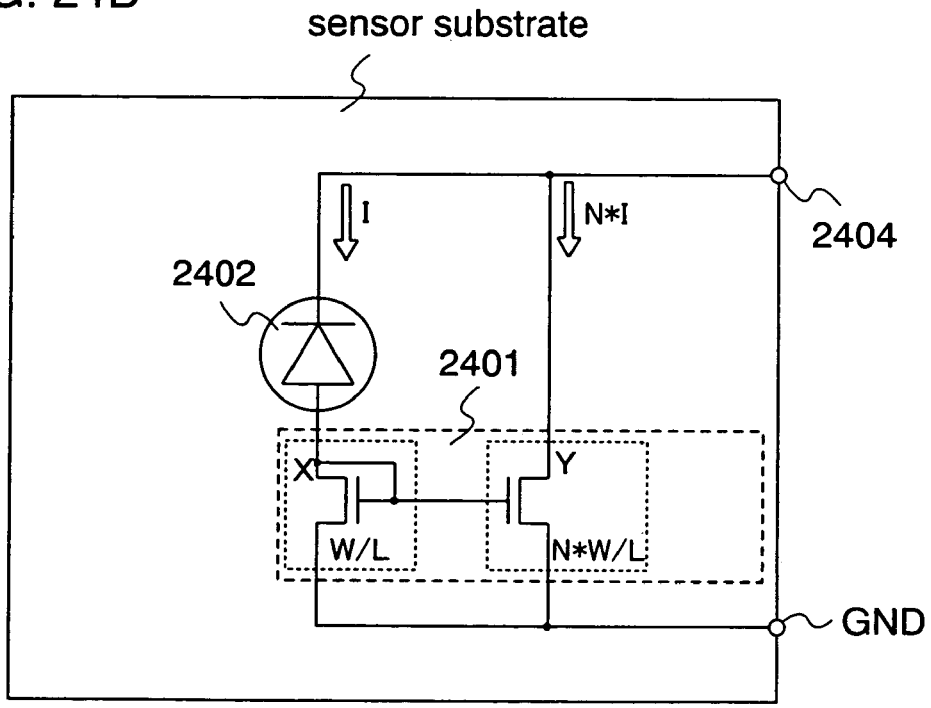

Note that N-channel TFTs are employed in this embodiment, however, P-channel TFTs may be employed as well. For the amplification, the number of parallel connections is N times as large in the circuit shown in FIG. 24A, however, the channel width W/the channel length L' may be N times as large as shown in FIG. 24B. In addition, other optical sensor element may be employed as a substitute for the photodiode.

[Embodiment 8]

Figure 25:
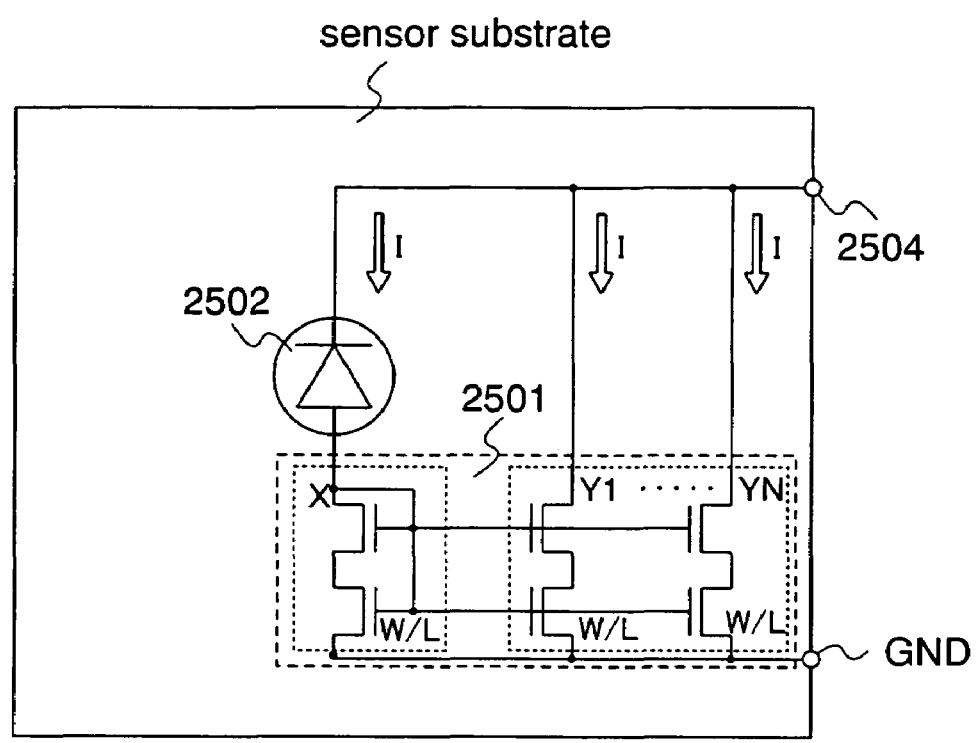
FIG. 25 is a diagram showing an embodiment of an optical sensor device of the invention.

FIG. 25 shows the eighth embodiment of the invention. This embodiment describes Embodiment Mode 6 in detail.

In this embodiment, an amplifier circuit 2501 configured by a TFT and a photodiode 2502 are formed integrally over a sensor substrate. An operation thereof is described below. As for TFTs in each of the X-side and the Y-side in the amplifier circuit 2501, they are disposed in series by connecting a source region and a drain region to each other and a multigate structure is formed by commonly connecting their gate electrodes. In addition, source regions of TFTs at the low-voltage-side stage in the amplifier circuit 2501 are connected to an external power source GND. The Y-side TFTs have N columns of parallel connections and drain regions thereof at the high-voltage-side stage are connected to an output terminal 2504. A drain region of the X-side TFT at the high-voltage-side stage is connected to a first electrode of the photodiode 2502. A second electrode of the photodiode 2502 is connected to the output terminal 2504.

When light is inputted to the photodiode 2502, optical current I flows in the direction from the second electrode toward the first electrode of the photodiode 2502. Consequently, current I flows into the X-side TFTs in the amplifier circuit 2501, generating voltage for flowing the current I at each gate thereof.

As for the X-side TFTs and the Y-side TFTs, since the gate length L and the channel width W are equal to each other and each gate of the Y-side TFTs is connected to respective gate of the X-side TFTs, the current I flows into each column of the Y-side TFTs. Accordingly, when the optical current I flows into the photodiode 2502, the amount of current flowing into the output terminal 2504 becomes (1+N)*I.

Note that N-channel TFTs are employed in this embodiment, however, P-channel TFTs may be employed as well. Other optical sensor element may be employed as a substitute for the photodiode.

[Embodiment 9]

Figure 26:
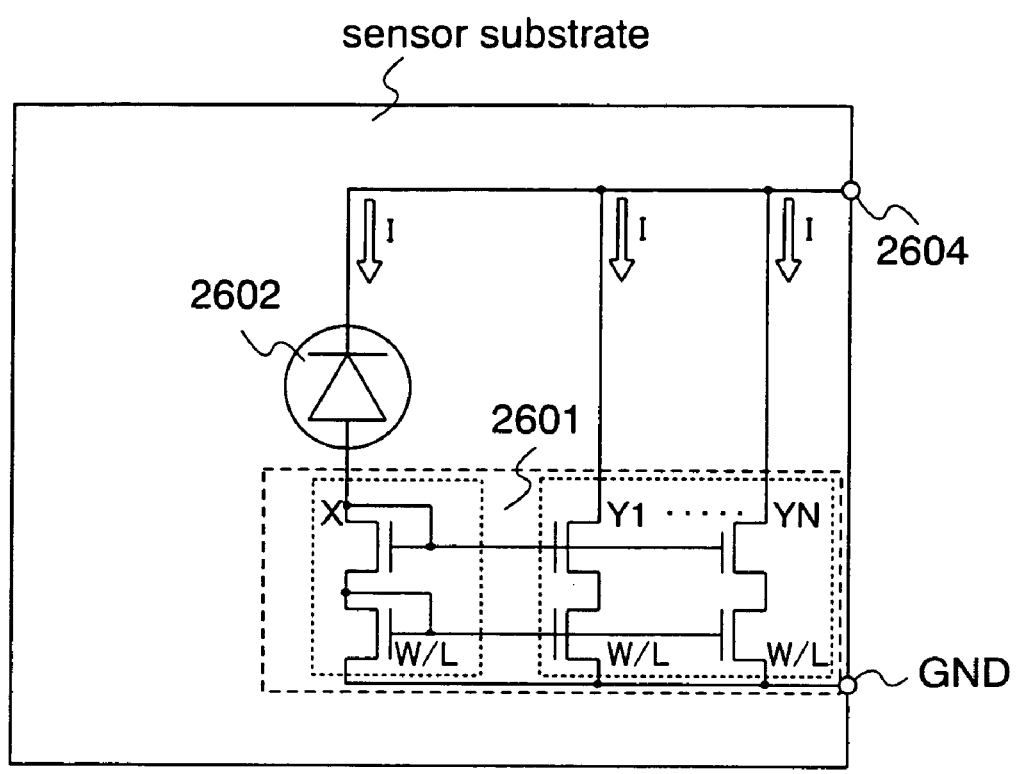
FIG. 26 is a diagram showing an embodiment of an optical sensor device of the invention.

FIG. 26 shows the ninth embodiment of the invention. This embodiment describes Embodiment Mode 7 in detail.

In this embodiment, an amplifier circuit 2601 configured by a TFT and a photodiode 2602 are formed integrally over a sensor substrate. An operation thereof is described below. As for TFTs in each of the X-side and the Y-side in the amplifier circuit 2601, they are disposed in series by connecting a source region and a drain region to each other. Source regions of TFTs at the low-voltage-side stage in the amplifier circuit 2601 are connected to an external power source GND. The Y-side TFTs have N columns of parallel connections and drain regions thereof are connected to an output terminal 2604, in particular, the drain regions thereof at the high-voltage-side stage are connected to an output terminal 2604. A drain region of the X-side TFT at the high-voltage-side stage is connected to a first electrode of the photodiode 2602. A second electrode of the photodiode 2602 is connected to the output terminal 2604.

When light is inputted to the photodiode 2602, optical current I flows in the direction from the second electrode toward the first electrode of the photodiode 2602. Consequently, current I flows into the X-side TFTs in the amplifier circuit 2601, generating voltage for flowing the current I at each gate thereof.

As for the X-side TFTs and the Y-side TFTs, since the gate length L and the channel width W are equal to each other and each gate of the Y-side TFTs is connected to respective gate of the X-side TFTs, the current I flows into each column of the Y-side TFTs. Accordingly, when the optical current I flows into the photodiode 2602, the amount of current flowing into the output terminal 2604 becomes (1+N)*I.

Note that N-channel TFTs are employed in this embodiment, however, P-channel TFTs may be employed as well. Other optical sensor element may be employed as a substitute for the photodiode.

[Embodiment 10]

Figure 27:
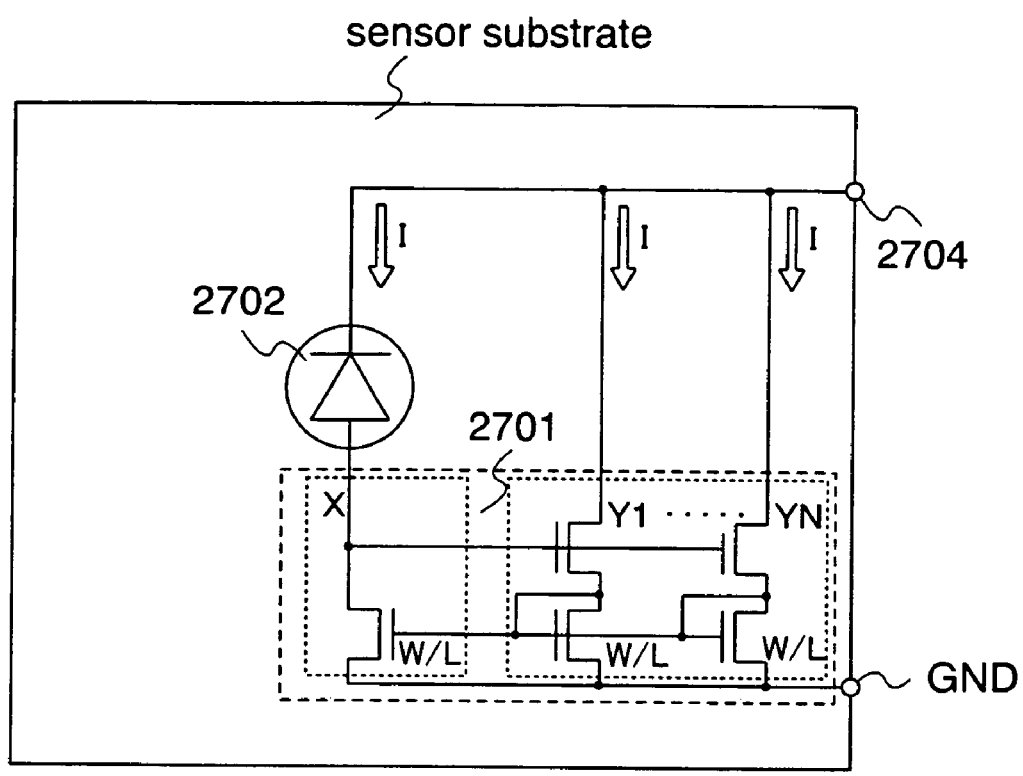
FIG. 27 is a diagram showing an embodiment of an optical sensor device of the invention.

FIG. 27 shows the tenth embodiment of the invention. This embodiment describes Embodiment Mode 8 in detail.

In this embodiment, an amplifier circuit 2701 configured by a TFT and a photodiode 2702 are formed integrally over a sensor substrate. An operation thereof is described below. The amplifier circuit 2701 is a Wilson current mirror circuit and source regions of TFTs at the low-voltage-side stage in the amplifier circuit 2701 are connected to an external power source GND. The Y-side TFTs have N columns of parallel connections and drain regions thereof are connected to an output terminal 2704. A drain region of the X-side TFT is connected to a first electrode of the photodiode 2702. A second electrode of the photodiode 2702 is connected to the output terminal 2704.

When light is inputted to the photodiode 2702, optical current I flows in the direction from the second electrode toward the first electrode of the photodiode 2702. Consequently, current I flows into the X-side TFT in the amplifier circuit 2701, generating voltage for flowing the current I at each gate thereof.

As for the X-side TFT and the Y-side TFTs, since the gate length L and the channel width W are equal to each other and each gate of the Y-side TFTs is connected to the gate of the X-side TFT, the current I flows into each column of the Y-side TFTs. Accordingly, when the optical current I flows into the photodiode 2702, the amount of current flowing into the output terminal 2704 becomes (1+N)*I.

Note that N-channel TFTs are employed in this embodiment, however, P-channel TFTs may be employed as well. Other optical sensor element may be employed as a substitute for the photodiode.

[Embodiment 11]

Figure 28:
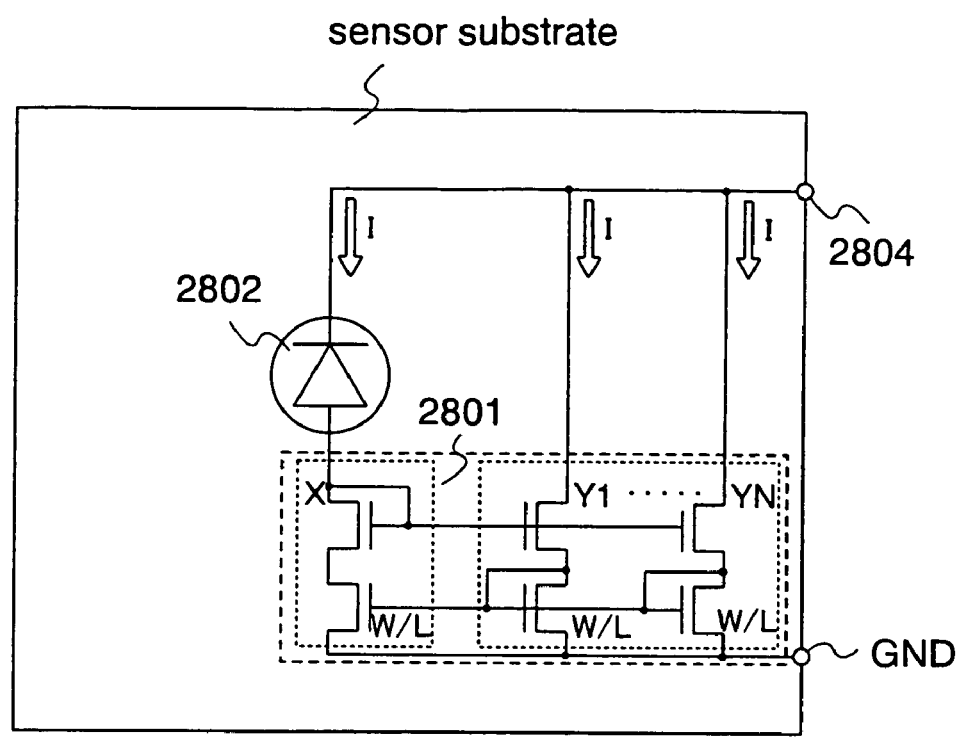
FIG. 28 is a diagram showing an embodiment of an optical sensor device of the invention.

FIG. 28 shows the eleventh embodiment of the invention. This embodiment describes Embodiment Mode 9 in detail.

In this embodiment, an amplifier circuit 2801 configured by a TFT and a photodiode 2802 are formed integrally over a sensor substrate. An operation thereof is described below. The amplifier circuit 2801 is an improved Wilson current mirror circuit and source regions of TFTs at the low-voltage-side stage in the amplifier circuit 2801 are connected to an external power source GND. The Y-side TFTs have N columns of parallel connections and drain regions thereof are connected to an output terminal 2804. A drain region of the X-side TFT in the amplifier circuit 2801 is connected to a first electrode of the photodiode 2802. A second electrode of the photodiode 2802 is connected to the output terminal 2804.

When light is inputted to the photodiode 2802, optical current I flows in the direction from the second electrode toward the first electrode of the photodiode 2802. Consequently, current I flows into the X-side TFTs in the amplifier circuit 2801, generating voltage for flowing the current I at each gate thereof.

As for the X-side TFTs and the Y-side TFTs, since the gate length L and the channel width W are equal to each other and each gate of the Y-side TFTs is connected to respective gate of the X-side TFTs, the current I flows into each column of the Y-side TFTs. Accordingly, when the optical current I flows into the photodiode 2802, the amount of current flowing into the output terminal 2804 becomes (1+N)*I.

Note that N-channel TFTs are employed in this embodiment, however, P-channel TFTs may be employed as well. Other optical sensor element may be employed as a substitute for the photodiode.

[Embodiment 12]

An optical sensor element such as a photodiode and a TFT can be formed integrally over an insulating substrate by utilizing the known technology, specifically, the technology disclosed in Japanese Patent Laid-Open No. Hei 11-125841, Japanese Patent Laid-Open No. 2002-305296, or Japanese Patent Laid-Open No. 2002-305297.

[Embodiment 13]

An optical sensor device of the invention having the above structures is applicable to a display portion of various electronic apparatuses as a luminance controller. Described below are electronic apparatuses using the optical sensor device of the invention.

Such electronic apparatuses include a video camera, a digital camera, a head mounted display (a goggle type display), a game machine, a car navigation system, a personal computer, a personal digital assistant (a mobile computer, a cellular phone, an electronic book, etc.), and a television.

Figure 16:
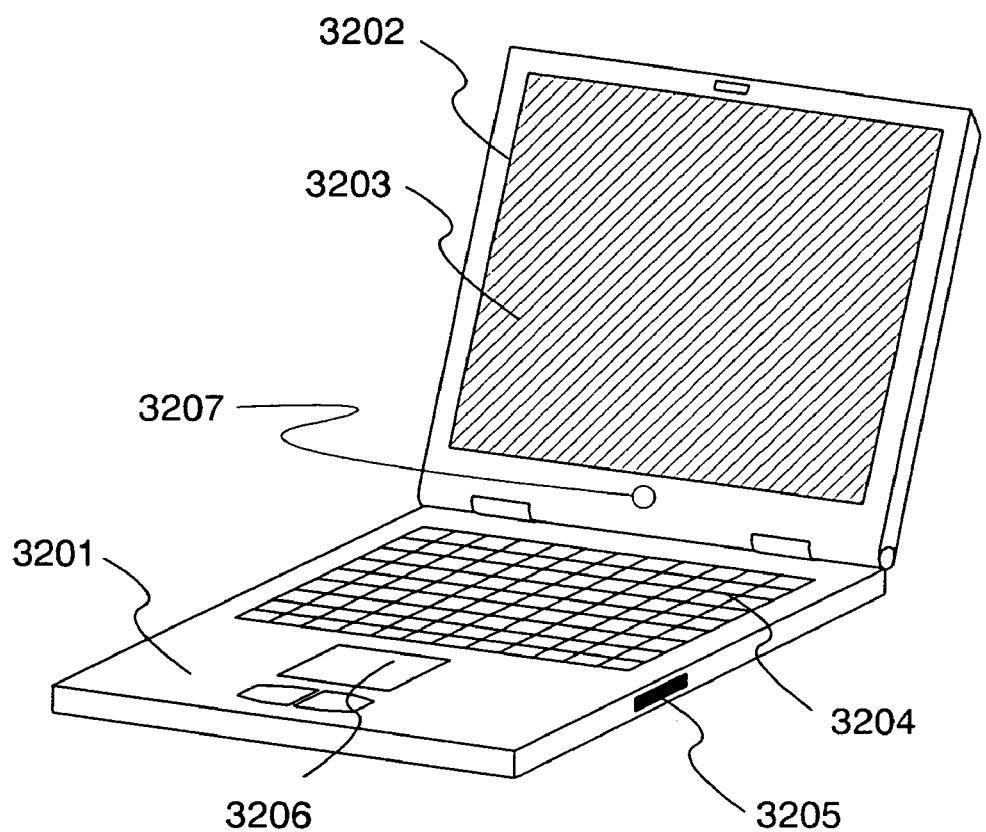
FIG. 16 is a view of a personal computer to which an optical sensor device of the invention is applied.

FIG. 16 illustrates a personal computer which includes a main body 3201, a housing 3202, a display portion 3203, a keyboard 3204, an external connecting port 3205, a pointing mouse 3206, an optical sensor portion 3207, and the like. The position of the optical sensor portion 3207 is not exclusively limited and another optical sensor portion may be additionally provided on the backside in the case where the display portion 3203 comprises a dual emission device that enables the image display on the backside, for example.

Personal computers, in particular, have been widely used for various purposes and in various situations recently. Depending on the outside brightness of the place where the personal computer is used, various display luminances are required for the display. In addition, when a personal computer is carried about with a user, the power source thereof depends on a battery in many cases, which leads one of the considerations of suppressing power consumption in order to use for long period. Therefore, the optical sensor portion 3207 preferably adopts the optical sensor device of the invention so that the outside brightness is detected and the display portion 3203 displays an image at a luminance according to the outside brightness, whereby a personal computer with low power consumption can be fabricated. Furthermore, in the case of a display device using an EL light emitting element, degradation with time of the EL light emitting element can be suppressed due to low power consumption according to the invention.

Figure 15B:
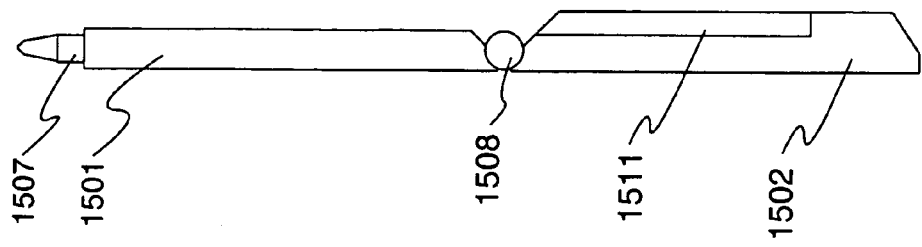
FIGS. 15A and 15B are views of a cellular phone to which an optical sensor device of the invention is applied.
Figure 15A:
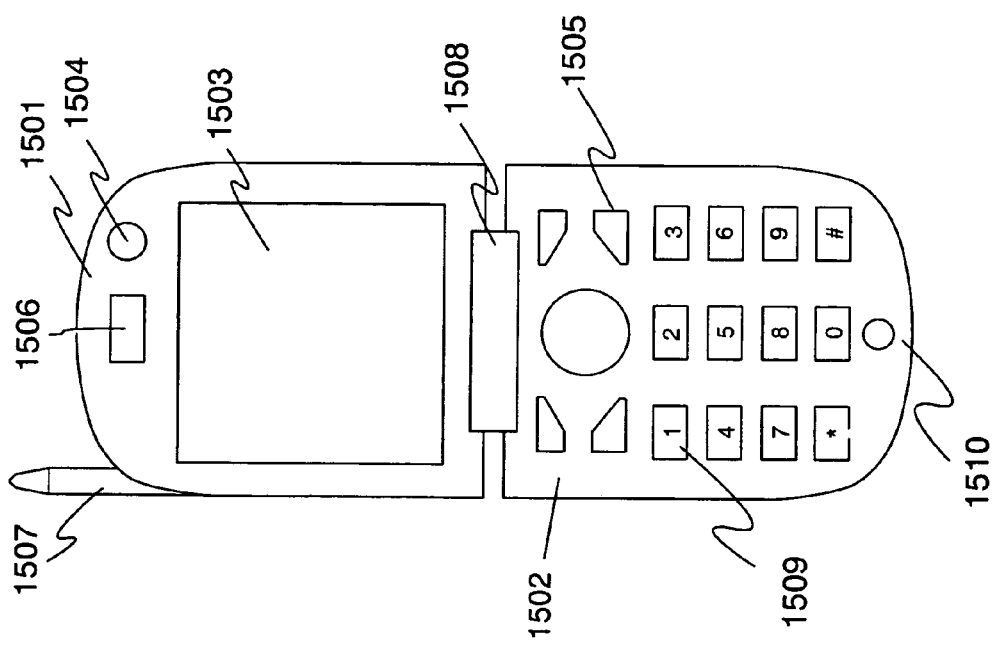

FIGS. 15A and 15B each illustrates a cellular phone which includes housings 1501 and 1502, a display portion 1503, an audio input portion 1510, an antenna 1507, operating keys 1505 and 1509, a speaker 1506, a hinge 1508, a battery 1511, an optical sensor portion 1504, and the like. The position of the optical sensor portion 1504 is not exclusively limited and another optical sensor portion may be additionally provided on the backside in the case where the display portion 1503 comprises a dual emission device that enables the image display on the backside, for example.

Cellular phones have been widely used and developed with various functions recently as well as personal computers. Such functions include a game, a camera, and Internet, and are used by means of a display device in many cases in various situations. Depending on the outside brightness of the place where the cellular phone is used, various display luminances are required for the display. In addition, the power source of a cellular phone depends on a battery in many cases, which leads one of the considerations of suppressing power consumption in order to use for long period. Therefore, the optical sensor portion 1504 preferably adopts the optical sensor device of the invention so that the outside brightness is detected, and the display portion 1503 and the operating keys 1505 and 1509 display images at a luminance according to the outside brightness, whereby a cellular phone with low power consumption can be fabricated. Furthermore, in the case of a display device using an EL light emitting element, aging degradation with time of the EL light emitting element can be suppressed due to low power consumption according to the invention.

The electronic apparatuses of this embodiment can be fabricated by using any combination of Embodiment Modes 1 to 9 and Embodiments 1 to 13.

The application range of the invention is quite wide and the invention is applicable to electronic apparatuses in various fields as well as the personal computer and the cellular phone described above.

This application is based on Japanese Patent Application serial no. 2003-327629 filed in Japan Patent Office on 19th, Sep., 2003 and Japanese Patent Application serial no. 2003-342632 filed in Japan Patent Office on 30th, Sep., 2003, the contents of which are hereby incorporated by reference.

What is claimed is:

1. An optical sensor device comprising:
    an optical sensor element; and
    a current mirror circuit comprising at least first, second, and third thin film transistors,
    wherein a first electrode of the optical sensor element is electrically connected to each of a first region of the first thin film transistor and a gate of the first thin film transistor,
    wherein a second electrode of the optical sensor element is electrically connected to each of a first region of the second thin film transistor, a first region of the third thin film transistor, and a terminal,
    wherein a second region of the first thin film transistor is electrically connected to each of a second region of the second thin film transistor and a second region of the third thin film transistor,
    wherein the gate of the first thin film transistor is electrically connected to each of a gate of the second thin film transistor and a gate of the third thin film transistor,
    wherein each gate length of the first, second, and third thin film transistor are equal,
    wherein each channel width of the first, second, and third thin film transistor are equal,
    wherein the amount of current flowing into the terminal is pronortional to the number of thin film transistors in the current mirror circuit, and
    wherein the optical sensor element and the current mirror circuit are formed over a substrate.

2. An optical sensor device according to claim 1, wherein the optical sensor element comprises amorphous silicon.

3. An optical sensor device according to claim 1, wherein the optical sensor element comprises an amorphous silicon photodiode.

4. An optical sensor device according to claim 1, wherein the optical sensor element comprises polysilicon.

5. An optical sensor device according to claim 1, wherein the optical sensor element comprises a polysilicon photodiode.

6. An electronic apparatus having an optical sensor device according to claim 1,
    wherein the electronic apparatus is one selected from the group consisting of a video camera, a digital camera, a head mounted display, a game machine, a car navigation system, a personal computer, a personal digital assistant and a television.

7. An optical sensor device according to claim 1, wherein the first, second and third thin film transistors have multigate structures.

8. An optical sensor device according to claim 1, wherein the current mirror circuit comprises a cascade connection.

9. An optical sensor device according to claim 1, wherein the current minor circuit comprises a Wilson connection.

10. An optical sensor device according to claim 1, wherein the current mirror circuit comprises an improved Wilson connection.

11. An optical sensor device according to claim 1, wherein the current mirror circuit comprises an N-channel thin film transistor.

12. An optical sensor device according to claim 1, wherein the current mirror circuit comprises a P-channel thin film transistor.

13. An optical sensor device according to claim 1, wherein the substrate is a plastic substrate.

14. An optical sensor device according to claim 1, wherein the substrate is a glass substrate.

15. An optical sensor device comprising:
an optical sensor element; and
a current mirror circuit comprising first and second thin film transistors,
wherein a first electrode of the optical sensor element is electrically connected to each of a first region of the first thin film transistor and a gate of the first thin film transistor,
wherein a second electrode of the optical sensor element is electrically connected to each of a first region of the second thin film transistor and a terminal,
wherein a second region of the first thin film transistor is electrically connected to a second region of the second thin film transistor,
wherein the gate of the first thin film transistor is electrically connected to a gate of the second thin film transistor,
wherein a ratio of channel width to gate length of the second thin film transistor is n times as large as that of the first thin film transistor,
wherein the amount of current flowing into the terminal is (1+n) times as large as that flowing in the first thin film transistor, and
wherein the optical sensor element and the current mirror circuit are formed over a substrate.

16. An optical sensor device according to claim 15, wherein the first and second thin film transistors have multigate structures.

17. An optical sensor device according to claim 15, wherein the current mirror circuit comprises a cascode connection.

18. An optical sensor device according to claim 15, wherein the current mirror circuit comprises a Wilson connection.

19. An optical sensor device according to claim 15, wherein the current mirror circuit comprises an improved Wilson connection.

20. An optical sensor device according to claim 15, wherein the current mirror circuit comprises an N-channel thin film transistor.

21. An optical sensor device according to claim 15, wherein the current mirror circuit comprises a P-channel thin film transistor.

22. An optical sensor device according to claim 15, wherein the substrate is a plastic substrate.

23. An optical sensor device according to claim 15, wherein the substrate is a glass substrate.

24. An electronic apparatus having an optical sensor device according to claim 15,
wherein the electronic apparatus is one selected from the group consisting of a video camera, a digital camera, a head mounted display, a game machine, a car navigation system, a personal computer, a personal digital assistant and a television.

25. An optical sensor device according to claim 15, wherein the optical sensor element comprises amorphous silicon.

26. An optical sensor device according to claim 15, wherein the optical sensor element comprises an amorphous silicon photodiode.

27. An optical sensor device according to claim 15, wherein the optical sensor element comprises polysilicon.

28. An optical sensor device according to claim 15, wherein the optical sensor element comprises a polysilicon photodiode.

* * * * *